United States Patent
Chung et al.

(10) Patent No.: US 9,508,898 B2
(45) Date of Patent: *Nov. 29, 2016

(54) NANOSTRUCTURE SEMICONDUCTOR LIGHT EMITTING DEVICE

(71) Applicant: Samsung Electronics Co., Ltd., Suwon-si, Gyeonggi-do (KR)

(72) Inventors: Byung Kyu Chung, Seoul (KR); Jung Sub Kim, Hwaseong-si (KR); Soo Jeong Choi, Hwaseong-si (KR); Yeon Woo Seo, Hwaseong-si (KR); Dong Gun Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/838,322

(22) Filed: Aug. 27, 2015

(65) Prior Publication Data

US 2016/0064608 A1    Mar. 3, 2016

(30) Foreign Application Priority Data

Aug. 28, 2014 (KR) .................. 10-2014-0113532

(51) Int. Cl.
*H01L 29/06* (2006.01)
*H01L 33/24* (2010.01)
(Continued)

(52) U.S. Cl.
CPC ............. *H01L 33/24* (2013.01); *H01L 33/12* (2013.01); *H01L 33/18* (2013.01); *H01L 33/32* (2013.01); *H01L 33/06* (2013.01); *H01L 33/08* (2013.01)

(58) Field of Classification Search
CPC ............. H01L 31/035227; H01L 31/035236; H01L 33/08; H01L 33/12; H01L 33/24; H01L 33/32

USPC .............................. 257/13, 88, 98
See application file for complete search history.

(56) References Cited

U.S. PATENT DOCUMENTS

| 6,372,608 B1 | 4/2002 | Shimoda et al. |
| 6,645,830 B2 | 11/2003 | Shimoda et al. |

(Continued)

FOREIGN PATENT DOCUMENTS

| JP | 5071215 B2 | 11/2012 |
| KR | 20060066872 A | 6/2006 |

(Continued)

OTHER PUBLICATIONS

A. Dadgar, et al.; "Eliminating stacking faults in semi-polar GaN by AlN interlayers"; Applied Physics Letters 99, 021905; Jul. 2011.

(Continued)

*Primary Examiner* — Brook Kebede
(74) *Attorney, Agent, or Firm* — Harness, Dickey & Pierce, P.L.C.

(57) ABSTRACT

There is provided a nanostructure semiconductor light emitting device including: a base layer formed of a first conductivity-type nitride semiconductor; and a plurality of light emitting nanostructures disposed to be spaced apart from one another on the base layer, wherein each of the plurality of light emitting nanostructures includes a nanocore formed of a first conductivity-type nitride semiconductor; a stress control layer disposed on a surface of the nanocore and including a nitride semiconductor containing indium; an active layer disposed on the stress control layer; a second conductivity-type nitride semiconductor layer disposed on the active layer; and a defect blocking layer disposed on at least a portion of the stress control layer and including a nitride semiconductor layer having a lattice constant lower than that of the stress control layer.

20 Claims, 21 Drawing Sheets

(51) Int. Cl.
- *H01L 33/32* (2010.01)
- *H01L 33/12* (2010.01)
- *H01L 33/18* (2010.01)
- *H01L 33/08* (2010.01)
- *H01L 33/06* (2010.01)

(56) References Cited

U.S. PATENT DOCUMENTS

| | | |
|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2008/0023689 A1 | 1/2008 | Kim et al. |
| 2008/0217632 A1 | 9/2008 | Tomiya et al. |
| 2010/0081226 A1 | 4/2010 | Abramov |
| 2010/0283064 A1* | 11/2010 | Samuelson ............ B82Y 20/00 257/88 |
| 2011/0309382 A1* | 12/2011 | Lowgren ............... B82Y 20/00 257/88 |
| 2012/0081467 A1 | 4/2012 | McAvoy et al. |
| 2012/0091467 A1 | 4/2012 | Chakraborty et al. |
| 2013/0009130 A1 | 1/2013 | Chen et al. |
| 2013/0032834 A1 | 2/2013 | Chen |
| 2013/0221322 A1* | 8/2013 | Ohlsson ................. B82Y 10/00 257/13 |
| 2014/0166974 A1* | 6/2014 | Yoo ......................... H01L 33/24 257/13 |
| 2014/0209858 A1* | 7/2014 | Cha ......................... H01L 33/20 257/13 |
| 2014/0209859 A1* | 7/2014 | Cha ........................ H01L 33/005 257/13 |
| 2014/0367638 A1* | 12/2014 | Herner .................... H01L 33/06 257/13 |
| 2015/0102365 A1* | 4/2015 | Cha ......................... H01L 33/24 257/88 |
| 2015/0194571 A1* | 7/2015 | Lee ........................ H01L 33/145 257/94 |
| 2015/0372186 A1* | 12/2015 | Cha ........................ H01L 33/005 438/34 |

FOREIGN PATENT DOCUMENTS

| | | |
|---|---|---|
| KR | 100795547 B1 | 1/2008 |
| KR | 20080010136 A | 1/2008 |
| KR | 20090029685 A | 3/2009 |
| KR | 101083872 | 10/2011 |
| KR | 20120064713 A | 6/2012 |
| KR | 20130143110 A | 12/2013 |
| KR | 20140018985 A | 2/2014 |
| WO | WO-2006030622 A2 | 12/2006 |
| WO | WO-2006130622 A2 | 12/2006 |

OTHER PUBLICATIONS

Matthias Auf Der Maur, et al. ; "A Parametric Study of InGaN/GaN Nanorod Core-Shell LEDs" ; IEEE Transactions on Electron Devices, vol. 60, No. 1 ; Jan. 2013.

Bing-Cheng Lin, et al. ; "Hole injection and electron overflow improvement in InGaN/GaN light-emitting diodes by a tapered AlGaN electron blocking layer" ; Optics Express, vol. 22, Issue 1, pp. 463-469 ; Jan. 2014.

Jai Verma, et al. ; "Tunnel-injection quantum dot deep-ultraviolet light-emitting diodes with polarization-induced doping in III-nitride heterostructures" ; Applied Physics Letters 104, 021105 ; Jan. 2014.

Katsumi Kishino, et al.; "Green-Light Nanocolumn Light Emitting Diodes With Triangular-Lattice Uniform Arrays of InGaN-Based Nanocolumns" ; IEEE Journal of Quantum Electronics, vol. 50, No. 7; Jul. 2014.

W.V. Lundin, et al. ; "High-Efficiency InGaN/GaN/AlGaN Light-Emitting Diodes with Short-Period InGaN/GaN Superlattice for 530-560 nm Range" ; Technical Physics Letters, 2010, vol. 36, No. 11, pp. 1066-1068 ; Nov. 2010.

Shuji Nakamura; "InGaN/GaN/AlGaN-based laser diodes grown on free-standing GaN substrates" ; Materials Science and Engineering B59 (1999) 370-375 ; May 1999.

Y. S. Lee, et al.; "Improved Thermal Stability of Green InGaN/GaN Multiple-Quantum-Well Light-Emitting Diodes with an AlGaN/GaN Short-Superlattice-Inserted Structure"; Journal of the Korean Physical Society, vol. 54, No. 1, pp. 140-144 ; Jan. 2009.

* cited by examiner

NANOSTRUCTURE SEMICONDUCTOR LIGHT EMITTING DEVICE

CROSS-REFERENCE TO RELATED APPLICATION

This application claims the priority to Korean Patent Application No. 10-2014-0113532 filed on Aug. 28, 2014, with the Korean Intellectual Property Office, the disclosure of which is incorporated herein by reference.

BACKGROUND

The present disclosure relates to a nanostructure semiconductor light emitting device.

A semiconductor light emitting device such as a light emitting diode (LED) is a device including a material that emits light upon the application of electrical energy thereto, in which energy generated when electrons and holes are recombined is converted into light to be emitted therefrom. LEDs, having many advantages as compared to related art light sources, such as relatively long lifespans, low degrees of power consumption, rapid response speeds, environmental friendliness, and the like, have been widely used in lighting devices and display devices and as lighting sources, and the development thereof has been accelerated.

Recently, as LEDs have come into widespread use, the utilization thereof has extended to the light sources of devices for use in high current and high output applications. Demand for LEDs for use in high current and/or high output applications has spurred ongoing research into improvements in light emitting characteristics in the art. In particular, semiconductor light emitting devices including light emitting nanostructures aiming at increasing luminous efficiency through enhancements in crystallinity, the prevention of a piezoelectric polarization phenomenon, and/or increases in light emitting areas, and the like, are under development.

SUMMARY

An example embodiment of the present disclosure may provide a novel nanostructure semiconductor light emitting device in which crystal defects in an active layer are reduced or prevented and light emitted therefrom has a relatively long wavelength by increasing the content of indium in the active layer.

According to an example embodiment of the present disclosure, a nanostructure semiconductor light emitting device may include: a base layer formed of a first conductivity-type nitride semiconductor; and a plurality of light emitting nanostructures disposed to be spaced apart from one another on the base layer, wherein each of the plurality of light emitting nanostructures includes a nanocore formed of the first conductivity-type nitride semiconductor; a stress control layer disposed on a surface of the nanocore and including a nitride semiconductor containing indium; an active layer disposed on the stress control layer; a second conductivity-type nitride semiconductor layer disposed on the active layer; and a defect blocking layer disposed on at least a portion of the stress control layer and including a nitride semiconductor layer having a lattice constant lower than that of the stress control layer.

The defect blocking layer may be disposed between the stress control layer and the active layer.

The defect blocking layer may be interspersed with the stress control layer.

The stress control layer may have a structure in which a first layer formed of $In_{x1}Ga_{1-x1}N$ ($0<x1<1$) and a second layer formed of $In_{x2}Ga_{1-x2}N$ ($0 \le x2 < x1$) are alternately stacked.

The defect blocking layer may be disposed above the at least one first layer.

The defect blocking layer may be interspersed with the second layer.

The defect blocking layer may be interspersed with the active layer.

The active layer may have a structure in which a quantum well layer formed of $In_{y1}Ga_{1-y1}N$ ($0<y1<1$) and a quantum barrier layer formed of $In_{y2}Ga_{1-y2}N$ ($0 \le y2 < y1$) are alternately stacked.

The defect blocking layer may be interspersed with the quantum barrier layer.

The defect blocking layer may include $Al_{z1}Ga_{1-z1}N$ ($0.3 \le z1 \le 0.4$).

The defect blocking layer may have a multilayer structure in which a first blocking layer formed of $Al_{z1}Ga_{1-z1}N$ ($0.3 \le z1 \le 0.4$) and a second blocking layer formed of $Al_{z2}Ga_{1-z2}N$ ($0 \le z2 \le z1$) are alternately stacked.

The defect blocking layer may have a thickness ranging from 15 nm to 40 nm.

According to another example embodiment of the present disclosure, a nanostructure semiconductor light emitting device may include: a base layer formed of a first conductivity-type nitride semiconductor; and a plurality of light emitting nanostructures disposed to be spaced apart from one another on the base layer, wherein each of the plurality of light emitting nanostructures includes a nanocore formed of the first conductivity-type nitride semiconductor; a stress control layer disposed on a surface of the nanocore and including a nitride semiconductor containing indium; an active layer disposed on the stress control layer; a second conductivity-type nitride semiconductor layer disposed on the active layer; and a defect blocking layer disposed on at least a portion of the stress control layer and including a nitride semiconductor layer having a lattice constant lower than that of the stress control layer, wherein the plurality of light emitting nanostructures include three groups in which diameters of the nanocores or pitches between the nanocores are different.

A thickness of the defect blocking layer of a group, among the three groups, emitting light having a longer wavelength may be greater.

One of the three groups may emit light having a peak wavelength equal to or greater than 540 nm.

According to another example embodiment of the present disclosure, a light emitting nanostructure comprises: a nanocore of a first conductivity-type nitride semiconductor; a stress control layer on a surface of the nanocore and including a nitride semiconductor containing indium; an active layer on the stress control layer; a second conductivity-type nitride semiconductor layer on the active layer; and a defect blocking layer on at least a portion of the stress control layer and including a nitride semiconductor layer having a lattice constant lower than that of the stress control layer.

The light emitting nanostructure may also include at least two of the stress control layer, the active layer, and the defect blocking layer are multi-layer structures the multi-layers of at least two of the stress control layer, the active layer, and the defect blocking layer are interspersed.

The light emitting nanostructure may also include a main portion and a tip portion, the light emitting nanostructure further comprising a current suppressing intermediate layer on only the tip portion.

According to another example embodiment of the present disclosure, a nanostructure semiconductor light emitting device comprises: a base layer of the first conductivity-type nitride semiconductor; and a plurality of light emitting nanostructures of claim 16, spaced apart from one another on the base layer.

The nanostructure semiconductor light emitting device may also include a plurality of light emitting nanostructures are arranged in three groups in which diameters of the nanocores or pitches between the nanocores are different.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
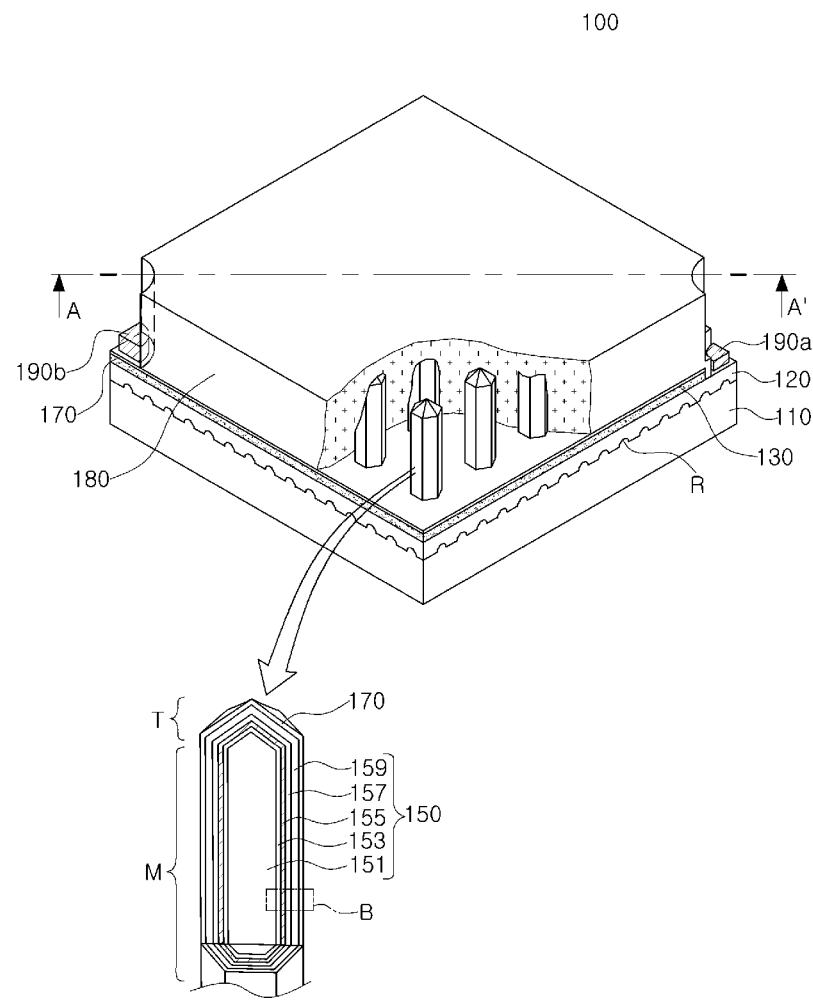
FIG. 1 is a perspective view schematically illustrating a nanostructure semiconductor light emitting device according to an example embodiment of the present disclosure.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, example embodiments of the inventive concepts are not limited to the specific examples provided herein and are exaggerated for clarity.

The terminology used herein is for the purpose of describing example embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the example embodiments in the detailed description will be described with sectional views as ideal example views of the inventive concepts. Accordingly, shapes of the example views may be modified according to manufacturing techniques and/or allowable errors. Therefore, the example embodiments of the inventive concepts are not limited to the specific shape illustrated in the example views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some example embodiments could be termed a second element in other example embodiments without departing from the teachings of the present invention. Example embodiments of aspects of the present inventive concepts explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic, in nature and their shapes are not intended to illustrate the actual shape of a region of a device and are not intended to limit the scope of example embodiments.

As appreciated by the present inventive entity, devices and methods of forming devices according to various example embodiments described herein may be embodied in microelectronic devices such as integrated circuits, wherein a plurality of devices according to various example embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various example embodiments described herein may include a plurality of the devices in an array and/or in a two-dimensional pattern that is based on the functionality of the microelectronic device.

The devices according to various example embodiments described herein may be interspersed among other devices depending on the functionality of the microelectronic device. Moreover, microelectronic devices according to various example embodiments described herein may be replicated in a third direction that may be orthogonal to the two different directions, to provide three-dimensional integrated circuits.

Accordingly, the cross-sectional view(s) illustrated herein provide support for a plurality of devices according to various example embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 2:
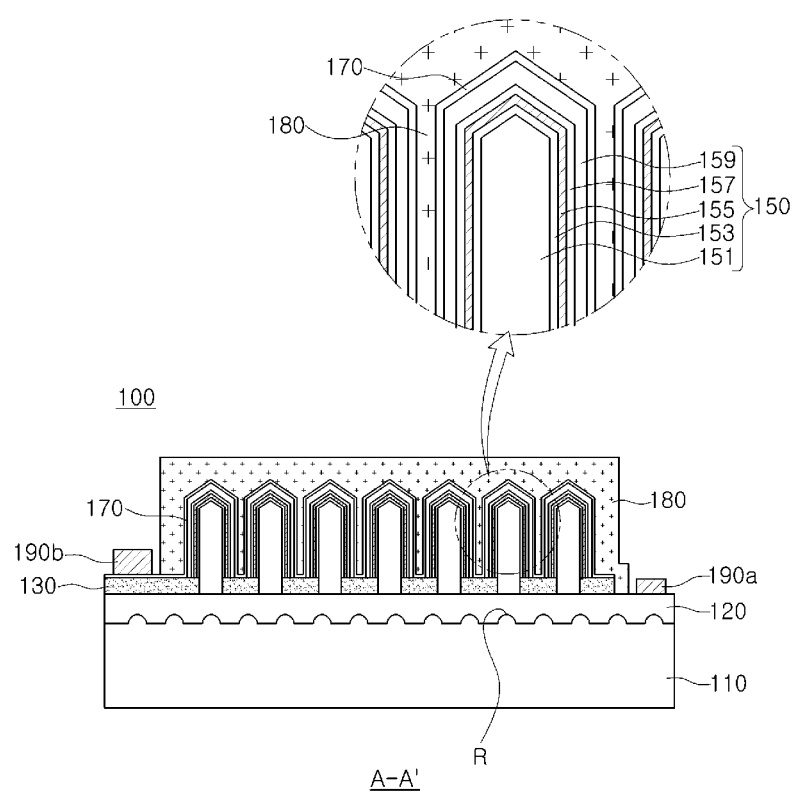
FIG. 2 is a cross-sectional view of the nanostructure, semiconductor light emitting device of FIG. 1 taken along line A-A'.

FIG. 1 is a perspective view schematically illustrating a nanostructure semiconductor light emitting device according to an example embodiment of the present disclosure, and FIG. 2 is a cross-sectional view of the nanostructure semiconductor light emitting device of FIG. 1 taken along line A-A'. In order to help in an understanding of the present disclosure, in FIG. 1, an insulating filler layer 180 is illustrated as being partially cutaway, and the number of light emitting nanostructures 150 illustrated in FIGS. 1 and 2 may be arbitrarily depicted.

Referring to FIGS. 1 and 2, a nanostructure semiconductor light emitting device 100 may include a substrate 110, a base layer 120 formed on the substrate 110, an insulating layer 130, a light emitting nanostructure 150, a contact electrode layer 170, and/or an insulating filler layer 180. The substrate 110 may have a depression and protrusion pattern R on a surface thereof. The light emitting nanostructure 150 having a core-shell structure may include a nanocore 151 grown on the base layer 120 formed of a first conductivity-type nitride semiconductor, and a stress control layer 153, a defect blocking layer 155, an active layer 157, and a second conductivity-type nitride semiconductor layer 159 sequentially disposed to cover the nanocore 151. The nanostructure semiconductor light emitting device 100 may include a contact electrode layer 170 connected to the second conductivity-type nitride semiconductor layer 159, and may further include a first electrode 190a disposed in a region of the base layer 120 and a second electrode 190b disposed in a region of the contact electrode layer 170.

The substrate 110 is provided as a semiconductor growth substrate and may be an insulating, conductive, or semiconductor substrate. For example, the substrate 110 may be formed of sapphire, SiC, Si, $MgAl_2O_4$, MgO, $LiAlO_2$, $LiGaO_2$, or GaN. Sapphire is a crystal having Hexa-Rhombo R3c symmetry, of which lattice constants in c-axial and a-axial directions are 13.001 Å and 4.758 Å, respectively, and has a c-plane (0001), an a-plane (1120), an r-plane (1102), and the like. In an example embodiment, the c-plane of sapphire crystal allows a nitride thin film to be relatively easily grown thereon and is stable at higher temperatures, so the sapphire substrate of the c-plane is commonly used as a nitride semiconductor growth substrate.

In order to enhance crystallinity of the base layer 120 grown on the substrate 110 and to increase light extraction efficiency, a depression and protrusion pattern may be formed on an upper surface of the substrate 110. The shape of the depression and protrusion pattern is not limited to that illustrated, and may have various shapes such as a columnar shape, a conical shape, a hemispherical shape, or the like. The depression and protrusion pattern may be formed in a regular or irregular shape or pattern.

The base layer 120, formed of a first conductivity-type nitride semiconductor, may provide a crystal plane for epitaxial-growth of a nanocore during a follow-up process and are commonly connected to one ends of the plurality of light emitting nanostructures 150 to serve as a contact electrode. The first conductivity-type nitride semiconductor forming the base layer 120 may be a nitride semiconductor satisfying $Al_xIn_yGa_{1-x-y}N$ ($0 \le x<1$, $0 \le y<1$, $0 \le x+y<1$). For example, the base layer 120 may be a GaN single crystal doped with an n-type impurity.

Although not shown, a buffer layer for enhancing crystallinity of the base layer 120 formed of a first conductivity-type semiconductor may be further disposed between the substrate 110 and the base layer 120. The buffer layer may be formed of $Al_xIn_yGa_{1-x-y}N$ ($0 \le x \le 1$, $0 \le y \le 1$, $0 \le x+y \le 1$) grown at low temperature without being doped. Materials such as $ZrB_2$, $HfB_2$, ZrN, HfN, TiN, and the like, may also be used as a buffer layer. Also, a plurality of material layers may be combined or a composition thereof may be gradually changed to be used as a buffer layer.

An insulating layer 130 having openings for the growth of nanocores 151 may be disposed on the base layer 120. Nanocores 151 may be grown on the base layer 120 exposed by the openings. In other words, the insulating layer 130 having openings may serve as a mask for the growth of the nanocores 151. The insulating layer 130 may be formed of a material having electrical insulation properties. The insulating layer 130 may be formed of an insulating material such as a silicon nitride ($Si_xN_y$), a silicon oxide ($SiO_x$), a silicon oxynitride ($SiO_xN_y$), an aluminum oxide ($Al_2O_3$), an aluminum nitride (AlN), or the like. Also, the insulating layer 130 may include two or more material layers including a graphene layer.

Each of the light emitting nanostructure 150 may include a main portion M having a hexagonal pillar structure and a tip portion T positioned on the main portion M. The main portion M of the light emitting nanostructure 150 has lateral surfaces having specific crystal planes (m planes), and the tip portion T of the light emitting nanostructure 150 may have crystal planes (r planes) different from the crystal faces of the lateral surfaces of the light emitting nanostructure 150. The tip portion T of the light emitting nanostructure 150 may have a hexagonal pyramidal shape. Such differentiation of the structure may be determined by the nanocore 151, and the nanocore 151 may be differentiated by the main portion M and the tip portion T.

The light emitting nanostructure 150 may include the nanocore 151 formed of a first conductivity-type nitride semiconductor, a stress control layer 153, a defect blocking layer 155, an active layer 157, and a second conductivity-type nitride semiconductor layer 159.

The first conductivity-type nitride semiconductor forming the nanocore 151 may be a nitride semiconductor satisfying a composition of $Al_xIn_yGa_{1-x-y}N$ ($0 \leq x < 1$, $0 \leq y < 1$, $0 \leq x+y < 1$) doped with an n-type impurity, similar to that of the base layer 120. For example, the nanocore 151 may be formed of GaN doped with an n-type impurity. The first conductivity-type nitride semiconductor forming the nanocore 151 may be formed using a metal-organic vapor phase epitaxy (MOVPE) process, a hydride vapor phase epitaxy (HVPE) process, a molecular beam epitaxy (MBE) process, and the like.

The stress control layer 153 may be disposed between the nanocore 151 and the active layer 157. When stress exists between the nanocore 151 and the active layer 157 due to a difference in lattice constants, a defect such as a stacking fault may be generated in the active layer 157 and the content of indium of the active layer 157 may be reduced or prevented. In particular, the low content of indium may make it difficult to obtain light having a relatively long wavelength (e.g., having a peak wavelength of 540 nm or greater) emitted from the active layer 157. The stress control layer 153 may be disposed between the nanocore 151 and the active layer 157 to lessen stress due to a difference in lattice constants to reduce or prevent defects in the active layer.

The stress control layer 153 may have a nitride semiconductor containing indium. For example, the stress control layer 153 may have a superlattice structure in which a first layer formed of $In_{x1}Ga_{1-x1}N$ ($0 < x1 < 1$) and a second layer formed of $In_{x2}Ga_{1-x2}N$ ($0 \leq x2 < x1$) are alternately stacked. The stress control layer 153 may have an identical conductivity type to that of the nanocore 151. For example, the stress control layer 153 may be doped with an n-type impurity.

In an example embodiment of the present disclosure, the defect blocking layer 155 may be provided between the stress control layer 153 and the active layer 157. In order to obtain emitted light having a relatively long wavelength (e.g., having a peak wavelength of 540 nm or greater) from the active layer 157, the content of indium of the active layer 157 needs to be increased. In an example embodiment, in order to cancel out mismatch between lattice constants of the active layer 157 and the underlying layers thereof, the content of indium of the stress control layer 153 needs to be increased. Here, an increase in the content of indium of the stress control layer 153 may cause a defect such as a stacking fault in the stress control layer 153. Such a stacking fault may propagate to the active layer 157 disposed on the stress control layer 153. Resultantly, a desired content of indium of the active layer 157 may not be obtained and emitted light having a desired long wavelength may not be obtained. The defect blocking layer 155 may be disposed between the stress control layer 153 and the active layer 157 to reduce or prevent propagation of a stacking fault from the stress control layer 153 to the active layer 157 and/or serve to increase the content of indium of the active layer 157.

The defect blocking layer 155 may have a nitride semiconductor containing aluminum. For example, the defect blocking layer 155 may include a nitride semiconductor satisfying a composition of $Al_{z1}Ga_{1-z1}N$ ($0.3 \leq z1 \leq 0.4$). The defect blocking layer 155 may have a multilayer structure in which a first blocking layer formed of $Al_{z1}Ga_{1-z1}N$ ($0.3 \leq z1 \leq 0.4$) and a second blocking layer formed of $Al_{z2}Ga_{1-z2}N$ ($0 \leq z2 < z1$) are alternately stacked. The defect blocking layer 155 may have an identical conductivity type to that of the nanocore 151. For example, the defect blocking layer 155 may be doped with an n-type impurity. A thickness of the defect blocking layer 155 may be appropriately determined within a range from 15 nm to 40 nm in consideration of a size, or the like, of the light emitting nanostructure 150.

The active layer 157 may include a nitride semiconductor containing indium. The active layer 157 may have a multi-quantum well (MQW) structure in which quantum well layers formed of $In_{y1}Ga_{1-y1}N$ ($0 < y1 < 1$) and quantum barrier layers formed of $In_{y2}Ga_{1-y2}N$ ($0 \leq y2 < y1$) are alternately stacked. For example, the active layer 157 may have an MQW structure including GaN/InGaN. If necessary, the active layer 157 may have a single-quantum well (SQW) structure containing indium.

The second conductivity-type nitride semiconductor layer 159 is a crystal satisfying a composition of $Al_xIn_yGa_{1-x-y}N$ ($0 \leq x < 1$, $0 \leq y < 1$, $0 \leq x+y < 1$) doped with a p-type impurity, and may include a plurality of layers as needed. According to example embodiments, the second conductivity-type nitride semiconductor layer 159 may further include an electron blocking layer in a portion adjacent to the active layer 157. The electron blocking layer will be described in detail with reference to FIGS. 3A through 3D hereinafter.

The contact electrode layer 170 may be formed of a material that may form ohmic-contact with the second conductivity-type nitride semiconductor layer 159 of the light emitting nanostructure 150. For example, the contact electrode layer 170 may include at least one among Ag, Ni, Al, Rh, Pd, Ir, Ru, Mg, Zn, Pt, and Au, and may be formed as a thin film having a single layer or a structure including a plurality of layers. Also, the contact electrode layer 170 may be formed of a transparent conductive oxide (TCO). For example, the contact electrode layer 170 may be at least one selected from the group consisting of indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$, and zinc magnesium oxide ($ZN_{(1-x)}Mg_xO$) ($0 \leq x \leq 1$). If necessary, the contact electrode layer 170 may include graphene. The contact electrode layer 170 may be formed through a deposition process such as a chemical vapor deposition (CVD) process or a physical vapor deposition (PVD) process.

The insulating filler layer 180 may be an oxide or a nitride. According to circumstances, as a material of the insulating filler layer 180, tetraethylorthosilicate (TEOS), borophosphosilicate glass (BPSG), spin-on glass (SOG), spin-on dielectric (SOD), and the like, may be used. Also, the insulating filler layer 180 may be a light-transmissive resin selected from among an epoxy resin, a silicon resin, polyethylene, and polycarbonate.

The first electrode 190a and the second electrode 190b may be disposed in an exposed region of the base layer 120 and a region of the contact electrode layer 170, respectively.

As materials of the first electrode 190a and the second electrode 190b, Au, Ag, Al, Ti, W, Cu, Sn, Ni, Pt, Cr, ZnO, ITO, graphene, Sn, TiW, AuSn, and the like, may be used.

FIGS. 3A through 3D are schematic views illustrating stacking structures of light emitting nanostructures applicable to an example embodiment of the present disclosure. FIGS. 3A through 3D are cross-sectional views enlarging a region "B" of FIG. 1. The stacking structures illustrated in FIGS. 3A through 3D illustrate application examples of a defect blocking layer.

Figure 3A:
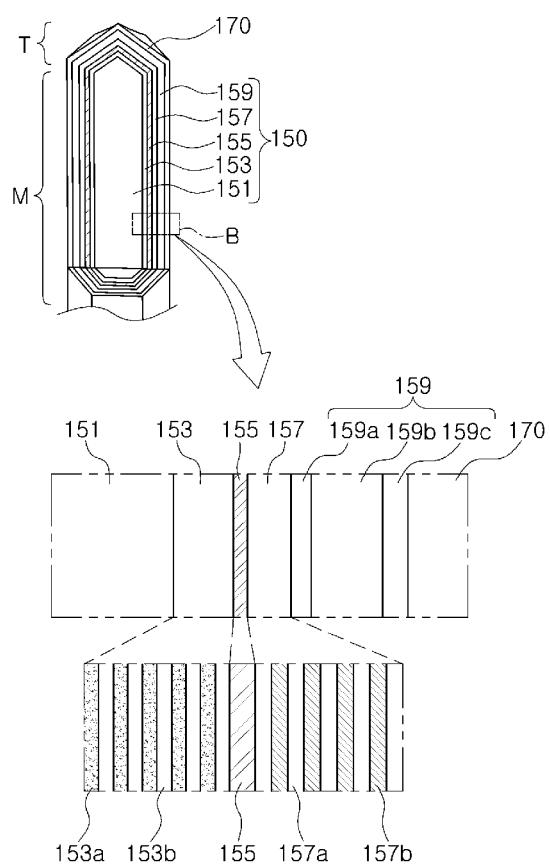
FIGS. 3A through 3D are schematic views illustrating stacking structures of light emitting nanostructures applicable to an example embodiment of the present disclosure.

Referring to a stacking structure illustrated in FIG. 3A, a light emitting nanostructure 150 according to an example embodiment of the present disclosure may include a nanocore 151 formed of an n-type GaN, a stress control layer 153 disposed on the nanocore 151 and containing indium (In), and a defect blocking layer 155 disposed on the stress control layer 153 and containing aluminum (Al).

The stress control layer 153 may have a superlattice structure in which first layers 153a formed of $In_{x1}Ga_{1-x1}N$ (0<x1<1) and second layers 135b formed of $In_{x2}Ga_{1-x2}N$ (0≤x2<x1) are alternately stacked. In FIGS. 3A through 3D, it is illustrated that the stress control layer 153 is formed by alternately stacking the first layers 153a and the second layers 153b five times, but the present disclosure is not limited thereto. The second layer 153b may disperse stress due to the first layers 153a including a relatively large amount of indium to increase an overall thickness (e.g., the number of layers) of the first layers 153a. According to example embodiments, the first layers 153a and the second layers 153b may be alternately stacked ten or more times. GaN of the stress control layer 153 does not greatly affect stress controlling, but if GaN is too thick, the effect of alleviating stress by InGaN may be reduced or prevented.

At least a portion of the first layers 153a of the stress control layer 153 may have a different thickness. For example, the first layers 153a of the stress control layer 153 may be arranged such that thicknesses thereof decrease in a direction away from the nanocore 151. Conversely, the first layers of the stress control layer 153 may be arranged such that thicknesses thereof increase in a direction away from the nanocore 151. Also, at least a portion of the second layers 153b of the stress control layer 153 may have a different thickness.

At least a portion of the first layers 153a of the stress control layer 153 may be designed to have a different content of indium. For example, the content of indium of the first layers 153a may increase in a direction away from the nanocore 151. Conversely, the content of indium of the first layers 153a may decrease in a direction away from the nanocore 151. The stress control layer 153 may be doped with a first conductivity-type impurity (e.g., an n-type impurity).

The defect blocking layer 155 may be a single layer including a nitride semiconductor satisfying $Al_{z1}Ga_{1-z1}N$ (0.3≤z1≤0.4). The defect blocking layer 155 may have a first conductivity type identical to that of the nanocore 151. For example, the defect blocking layer 155 may be doped with an n-type impurity. A thickness of the defect blocking layer 155 may be appropriately determined with a range from 15 nm to 40 nm. As the thickness of the defect blocking layer 155 increases, an effect of blocking a stacking fault may be improved, but if the defect blocking layer 155 is too thick, the effect of blocking a stacking fault may disappear. Also, the effect of the stress control layer 153 to alleviate stress of the active layer 157 may be reduced or prevented.

The light emitting nanostructure 150 according to an example embodiment of the present disclosure may further include an active layer 157, a second conductivity-type nitride semiconductor layer 159, and a contact electrode layer 170 sequentially disposed on the defect blocking layer 155.

The active layer 157 may have an MQW structure in which quantum well layers 157b formed of $In_{y1}Ga_{1-y1}N$ (0<y1<1) and quantum barrier layers 157a formed of $In_{y2}Ga_{1-y2}N$ (0≤y2<y1) are alternately stacked. For example, the active layer 157 may have an MQW structure including GaN/InGaN.

Example embodiments may be advantageously used when a high content of indium is required in the active layer 157. For example, the active layer 157 may have the quantum well layer 157b emitting light having a relatively long wavelength such as green light, yellow light, red light, or the like. The content (y1) of indium of the quantum well layer 157b may be 0.2 or greater. The active layer 157 may emit light having a peak wavelength equal to or greater than 540 nm.

The second conductivity-type nitride semiconductor layer 159 may include an electron blocking layer 159a, a p-type GaN layer 159b having a low concentration, and a p-type GaN layer 159c having a high concentration. The p-type GaN layer 159c having a high concentration may be provided as a contact layer. The electron blocking layer 159a may have a structure in which a plurality of $Al_xIn_yGa_{1-x-y}N$ (0≤x<1, 0≤y<1, 0≤x+y<1) layers having different compositions are stacked. The electron blocking layer 159a has an energy band gap greater than that of the active layer 157, and thus, electrons can be reduced or prevented from being injected from the nanocore 151, an n-type GaN single crystal, so as not to be recombined in the active layer 157, but transferred to the p-type GaN layer 159b instead. The electron blocking layer 159a may be doped with a p-type impurity.

The contact electrode layer 170 may be formed of a material that may form ohmic-contact with the second conductivity-type nitride semiconductor layer 159 as described above with reference to FIGS. 1 and 2. For example, the contact electrode layer 170 may include at least one of Ag, Ni, Al, Rh, Pd, Ir, Ru, Mg, Zn, Pt, and Au, and may be a thin film as a single layer or may be a thin film having a plurality of layers. Also, the contact electrode layer 170 may be formed of a transparent conductive oxide (TCO).

Figure 3B:
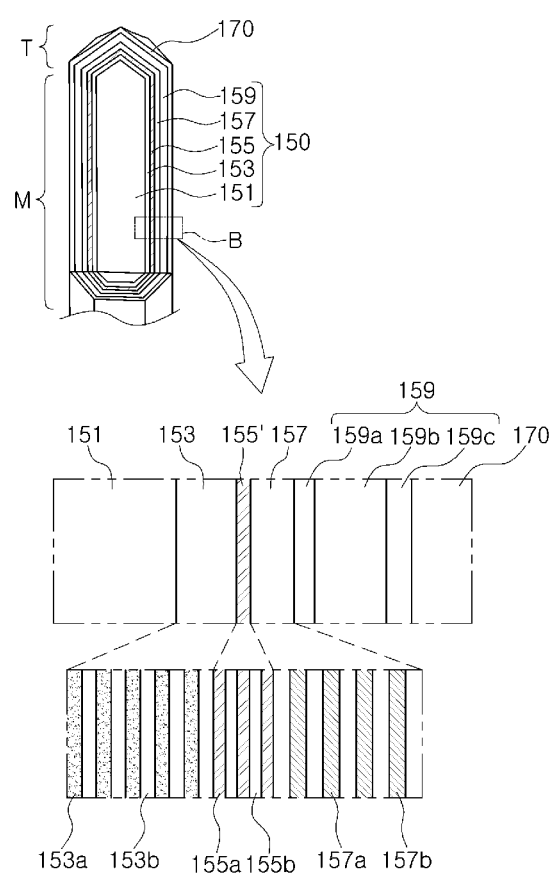

Referring to a stacking structure illustrated in FIG. 3B, a light emitting nanostructure 150 according to an example embodiment of the present disclosure may include a nanocore 151 formed of n-type GaN, a stress control layer 153 disposed on the nanocore 151 and containing indium (In), and a defect blocking layer 155' disposed on the stress control layer 153 and containing aluminum (Al). Also, the light emitting nanostructure 150 may include an active layer 157, a second conductivity-type nitride semiconductor layer 159, and a contact electrode layer 170 sequentially disposed on the defect blocking layer 155'.

Unlike the defect blocking layer 155 described above with reference to FIG. 3A, the defect blocking layer 155' according to the present example embodiments may have a multilayer structure in which first blocking layers 155a formed of $Al_{z1}Ga_{1-z1}N$ (0.3≤z1≤0.4) and second blocking layers 155b formed of $Al_{z2}Ga_{1-z2}N$ (0≤z2<z1) are alternately stacked. The defect blocking layers 155' may have a first conductivity-type identical to that of the nanocore 151. For example, the defect blocking layers 155' may be doped with an n-type impurity. A thickness of the first blocking layer 155a of the defect blocking layer 155' may be appropriately determined within a range from 15 nm to 40 nm in consideration of a size, or the like, of the light emitting nanostructure 150.

Figure 3C:
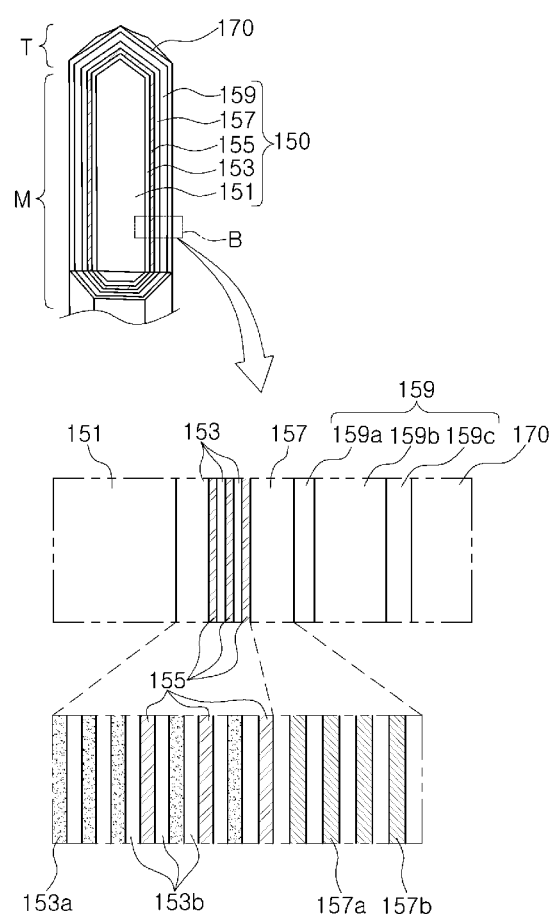

Referring to a specific stacking structure illustrated in FIG. 3C, a light emitting nanostructure 150 according to an example embodiment of the present disclosure may include a nanocore 151 formed of n-type GaN, a stress control layer 153 disposed on the nanocore 151 and containing indium (In), and defect blocking layers 155 disposed on the stress control layer 153 and containing aluminum (Al). Also, the light emitting nanostructure 150 may include an active layer 157, a second conductivity-type nitride semiconductor layer 159, and a contact electrode layer 170 sequentially disposed on the defect blocking layers 155.

The stress control layer 153 may have a superlattice structure in which first layers 153a formed of $In_{x1}Ga_{1-x1}N$ (0<x1<1) and second layers 135b $In_{x2}Ga_{1-x2}N$ (0≤x2<x1) are alternately stacked. The second layers 153b may be, for example, GaN layers. At least a portion of the first layers 153a of the stress control layer 153 may be designed to have a different content of indium. The stress control layer 153 may be doped with a first conductivity-type impurity (e.g., an n-type impurity).

The defect blocking layers 155 may be formed of $Al_{z1}Ga_{1-z1}N$ (0.3≤z1≤0.4), and the plurality of defect blocking layers 155 may be disposed to be interspersed with the second layers 153b of the stress control layer 153. The defect blocking layers 155 serve to block a stacking fault generated by the stress control layer 153, and, the defect blocking layers 155 are disposed in an upper region of the stress control layer 153. In FIG. 3C, it is illustrated that three defect blocking layers 155 are interspersed with the stress control layer 153, but the present disclosure is not limited thereto. The number of interspersed defect blocking layers 155 may differ according to configurations of the stress control layer 153.

The defect blocking layers 155 may have a first conductivity type identical to that of the nanocore 151. For example, the defect blocking layer 155 may be doped with an n-type impurity. A thickness of the defect blocking layers 155 may be appropriately determined within a range from 15 nm to 40 nm.

Figure 3D:
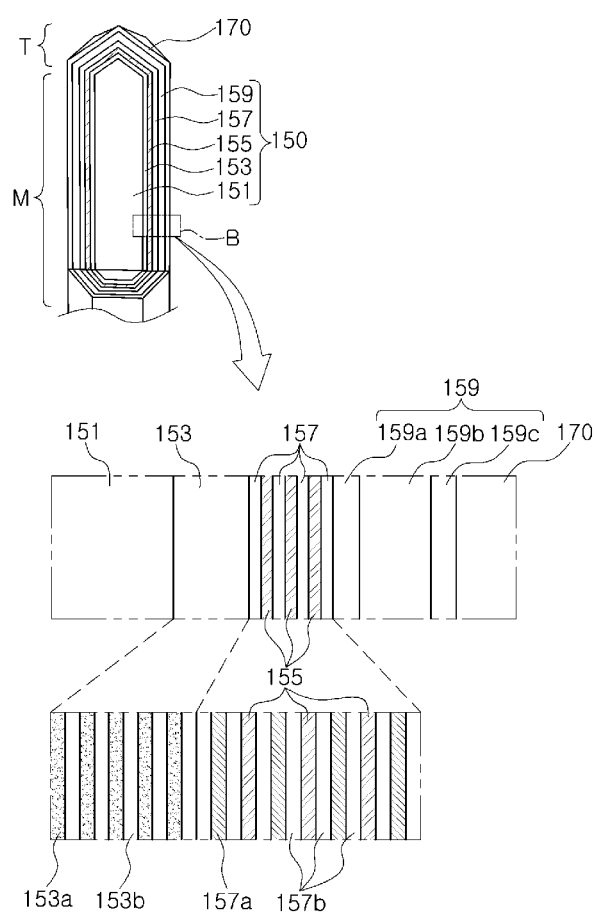

Referring to a specific stacking structure illustrated in FIG. 3D a light emitting nanostructure 150 according to an example embodiment of the present disclosure may include a nanocore 151 formed of n-type GaN, a stress control layer 153 disposed on the nanocore 151 and containing indium (In), an active layer 157 disposed on the stress control layer 153, and defect blocking layers 155 interspersed with the active layer 157 and containing aluminum (Al). Also, the light emitting nanostructure 150 may include a second conductivity-type nitride semiconductor layer 159 and a contact electrode layer 170 sequentially disposed on the active layer 157.

The active layer 157 may have an MQW structure in which quantum well layers 157b formed of $In_{y1}Ga_{1-y1}N$ (0<y1<1) and quantum barrier layers 157a formed of $In_{y2}Ga_{1-y2}N$ (0≤y2<y1) are alternately stacked. For example, the active layer 157 may have an MQW structure including GaN/InGaN.

Example embodiments may be advantageously used when a higher content of indium is required in the active layer 157. For example, the active layer 157 may have the quantum well layer 157b emitting light having a relatively long wavelength such as green light, yellow light, red light, and the like. The content (y1) of indium of the quantum well layer 157b may be 0.2 or greater. The active layer 157 may emit light having a peak wavelength equal to or greater than 540 nm.

The defect blocking layers 155 may be formed of $Al_{z1}Ga_{1-z1}N$ (0.3≤z1≤0.4), and the plurality of defect blocking layers 155 may be disposed to be interspersed with the quantum barrier layer 157b of the active layer 157. In FIG. 3D, it is illustrated that three defect blocking layers 155 are interspersed with the active layer 157, but the present disclosure is not limited thereto. The number of interspersed defect blocking layers 155 may differ according to configurations of the active layer 157.

Unlike the defect blocking layers described above with reference to FIGS. 3A through 3C, the defect blocking layers 155 interspersed with the active layer 157 are not doped with an impurity. Here, the reason is the same as that of the active layer 157 is not being doped. Namely, when the defect blocking layers are doped with an impurity, non-radiative recombination occurs to degrade luminous efficiency. A thickness of the defect blocking layers 155 may be appropriately determined within a range from 15 nm to 40 nm.

FIGS. 4A through 4E are cross-sectional views illustrating major processes of a method for manufacturing a nanostructure semiconductor light emitting device according to an example embodiment of the present disclosure.

In example embodiments, a stacking structure of a light emitting nanostructure will be described based on that illustrated in FIG. 3A, but the present disclosure is not limited thereto. The stacking structures of light emitting nanostructures described above with reference to FIGS. 3B through 3D may also be applied to example embodiments.

Figure 4A:
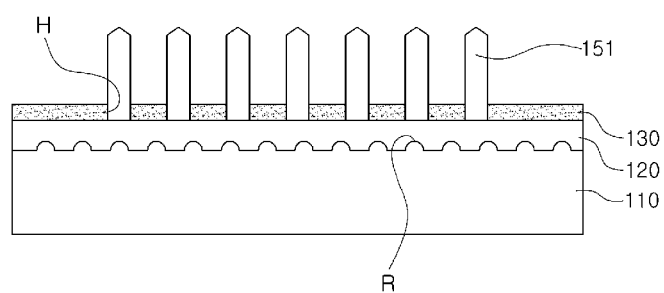
FIGS. 4A through 4E are cross-sectional views illustrating major processes of a method for manufacturing a nanostructure semiconductor light emitting device according to an example embodiment of the present disclosure.

As illustrated in FIG. 4A, a plurality of nanocores 151 may be formed on a base layer 120 formed of a first conductivity type nitride semiconductor.

A substrate 110 may have an upper surface with a depression and protrusion pattern R. The base layer 120 may be formed on an upper surface of the substrate 110. An insulating layer 130 having openings H is formed on the base layer 120. Nanocores 151 formed of a first conductivity-type nitride semiconductor may be selectively grown on exposed regions of the base layer 120 using the insulating layer 130 as a mask.

Figure 4B:
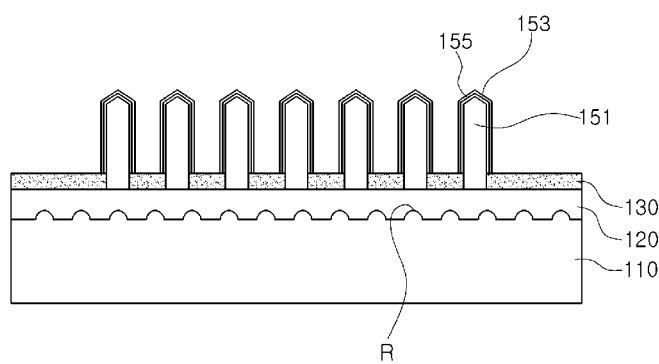

Thereafter, as illustrated in FIG. 4B, a stress control layer 153 and a defect blocking layer 155 may be sequentially formed on surfaces of the plurality of nanocores 151.

The stress control layer 153 may be obtained through a process of growing a nitride semiconductor layer containing indium (In). In example embodiments, the stress control layer 153 may have a superlattice structure formed by alternately growing a first layer formed of $In_{x1}Ga_{1-x1}N$ (0<x1<1) and a second layer formed of $In_{x2}Ga_{1-x2}N$ (0≤x2<x1). According to example embodiments, the stress control layer 153 may have a multilayer structure, rather than a superlattice structure. The stress control layer 153 may be doped with a first conductivity-type impurity (e.g., n-type impurities such as Si, Ge, etc.).

The defect blocking layer 155 may be obtained through a process of growing a nitride semiconductor layer containing aluminum (Al). The defect blocking layer 155 may be a monolayer including a nitride semiconductor satisfying $Al_zGa_{1-z}N$ (0.3≤z≤0.4). As described above with reference to FIG. 3B, the defect blocking layer 155 may have a multilayer structure in which a first blocking layer formed of $Al_{z1}Ga_{1-z1}N$ (0.3≤z1≤0.4) and a second blocking layer formed of $Al_{z1}Ga_{1-z1}N$ (0.3≤z1≤0.4) are alternately stacked. The defect blocking layer 155 may have a first conductivity type identical to that of the nanocore 151. For example, the defect blocking layer 155 may be doped with an n-type impurity.

Figure 4C:
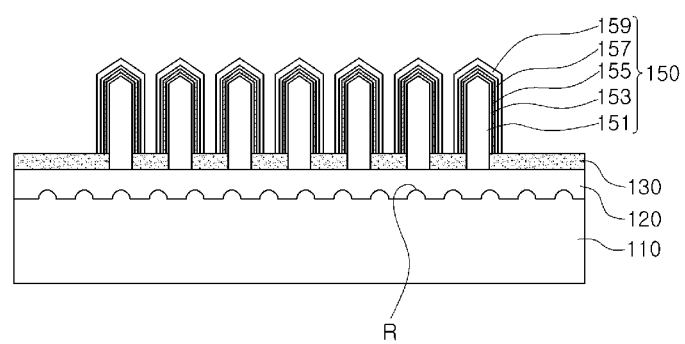

Subsequently, as illustrated in FIG. 4C, an active layer 157 and a second conductivity-type nitride semiconductor layer 159 may be sequentially formed on the defect blocking layer 155. Through this process, a light emitting nanostructure 150 having a desired stacking structure may be formed.

The active layer 157 may have a multi-quantum well (MQW) structure in which quantum well layers formed of $In_{y1}Ga_{1-y1}N$ (0<y1<1) and quantum barrier layers formed of $In_{y2}Ga_{1-y2}N$ (0≤y2<y1) are alternately stacked. In example embodiments, the quantum barrier layers may be formed of GaN.

Example embodiments may be advantageously used in the active layer 157 requiring a high content of indium. For example, the active layer 157 may be configured to emit light having a relatively long wavelength such as green light, yellow light, red light, and the like. For example, the quantum well layer of the active layer 157 may have a content of indium of y1>0.2 or greater. The active layer 157 may emit light having a peak wavelength equal to or greater than 540 nm.

The second conductivity-type semiconductor layer 159 may be a crystal satisfying a p-type $Al_xIn_yGa_{1-x-y}N$ (0≤x<1, 0≤y<1, 0≤x+y<1), and may include a plurality of layers as needed.

Figure 4D:
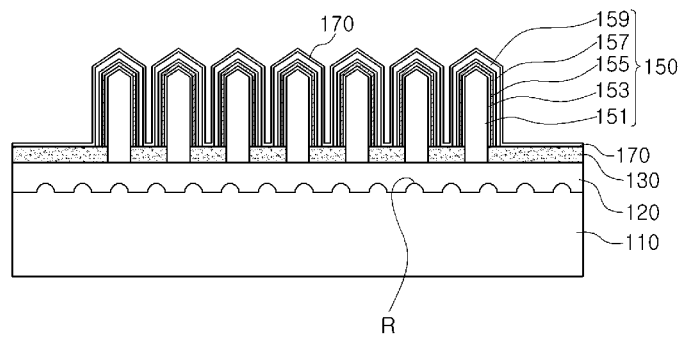

Thereafter, as illustrated in FIG. 4D, a contact electrode layer 170 may be formed on the light emitting nanostructures 150.

The contact electrode layer 170 may be formed on a surface of the second conductivity-type nitride semiconductor layer 159. The contact electrode layer 170 employed in example embodiments may be formed of a transparent conductive material, but the present disclosure is not limited thereto. The contact electrode layer 170 may be either a transparent conductive oxide layer or nitride layer. For example, the contact electrode layer 170 may be at least one selected from among ZITO, ZIO, GIO, ZTO, FTO, AZO, GZO, $In_4Sn_3O_{12}$, and $Zn_{(1-x)}Mg_xO$. If necessary, the contact electrode layer 1670 may be formed of a reflective electrode material.

Figure 4E:
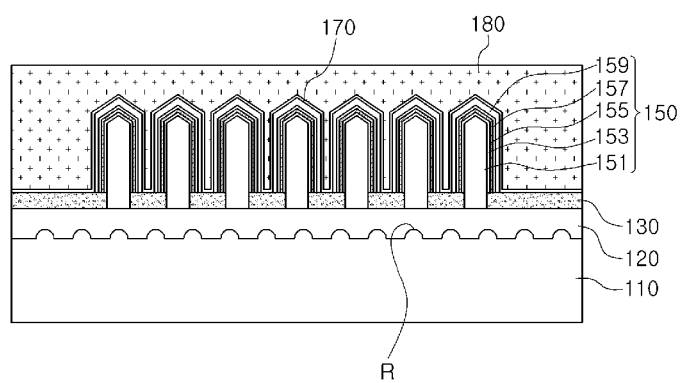

Subsequently, as illustrated in FIG. 4E, an insulating filler layer 180 may be formed to fill spaces between the light emitting nanostructures 150.

The insulating filler layer 180 may be formed of a light-transmissive material. The insulating filler layer 180 may be formed through a thin film deposition process such as a chemical, vapor deposition (CVD) process or a physical vapor deposition (PVD) process, a spin process, a reflow process, and the like. For example, the insulating filler layer 180 may be formed of a TEOS, BPSG, CVD-$SiO_2$, SOG, or SOD material. Alternatively, the insulating filler layer 180 may be an epoxy resin, a silicon resin, or a light-transmissive resin selected from among polyethylene and polycarbonate.

Figure 5:
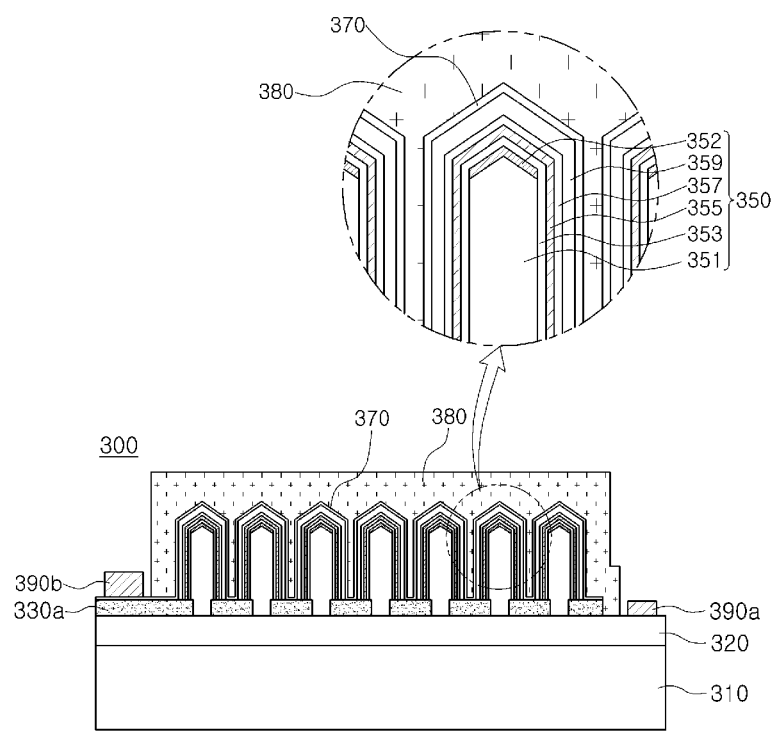
FIG. 5 is a cross-sectional view illustrating a nanostructure semiconductor light emitting device according to an example embodiment of the present disclosure.

FIG. 5 is a cross-sectional view illustrating a nanostructure semiconductor light emitting device according to an example embodiments of the present disclosure.

Referring to FIG. 5, a nanostructure semiconductor light emitting device 300 may include a substrate 310, a base layer 320 formed on the substrate 310, an insulating layer 330, a light emitting nanostructure 350, a contact electrode layer 370, and an insulating filler layer 380. Although not shown, the substrate 310 may have a depression and protrusion pattern on a surface thereof. The light emitting nanostructure 350 having a core-shell structure may include a nanocore 351 grown on the base layer 320 formed of a first conductivity-type nitride semiconductor, a current suppressing intermediate layer 352 disposed in a tip portion of the nanocore 351, and a stress control layer 353, a defect blocking layer 355, an active layer 357, and a second conductivity-type nitride semiconductor layer 359 sequentially disposed to cover the nanocore 351. The nanostructure semiconductor light emitting device 300 may include a contact electrode layer 370 connected to the second conductivity-type nitride semiconductor layer 359, and may further include a first electrode 390a disposed in a region of the base layer 320 and a second electrode 390b disposed in a region of the contact electrode layer 370.

Example embodiments, in order to obtain excellent luminous efficiency by effectively suppressing a leakage current generated at the tip portion of the nanocore 351, the current suppressing intermediate layer 352 disposed on the tip portion of the nanocore 351 may be provided. The current suppressing intermediate layer 352 may be a semiconductor layer which is not doped on purpose or may be a semiconductor layer doped with a second conductivity-type impurity opposite to that of the nanocore 351. For example, in a case in which the nanocore 351 is an n-type GaN, the current suppressing intermediate layer 352 may be an undoped GaN or a GaN doped with a p-type impurity.

FIGS. 6A through 6G are cross-sectional views illustrating major processes of a method for manufacturing a nanostructure semiconductor light emitting device according to example embodiments of the present disclosure. A method for manufacturing the nanostructure semiconductor light emitting device 300 illustrated in FIG. 5 will be described with reference to FIGS. 6A through 6G. Specifically, FIGS. 6A through 6G illustrate processes of growing nanocores in a filling manner using a mask as a mold structure. These processes may be understood as processes replacing the processes of forming the light emitting nanostructures illustrated in FIGS. 4A and 4E.

Example embodiments, a stacking structure of a light emitting nanostructure will be described based on the light emitting nanostructure illustrated in FIG. 3A, but the present disclosure is not limited thereto. The stacking structure of the light emitting nanostructure described above with reference to FIGS. 3B through 3D may also be applied to example embodiments.

Figure 6A:
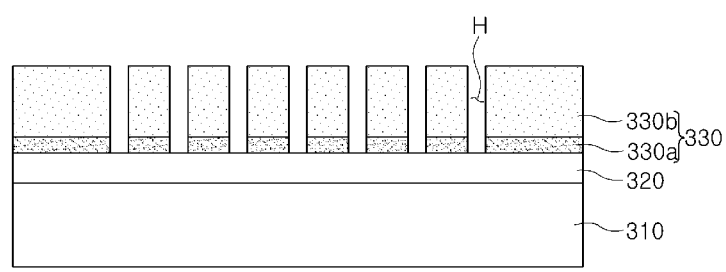
FIGS. 6A through 6G are cross-sectional views illustrating major processes of a method for manufacturing a nanostructure semiconductor light emitting device according to an example embodiment of the present disclosure.

As illustrated in FIG. 6A, a first conductivity-type nitride semiconductor may be grown on the substrate 310 to provide a base layer 320.

The base layer 320 may provide a crystal plane for growing light emitting nanostructures and may be provided as a structure electrically connecting the light emitting nanostructures. Thus, the base layer 320 may be formed as a semiconductor single crystal having electrical conductivity. When the base layer 320 is directly grown, the substrate 110 may be a crystal growth substrate. Before forming the base layer 320, a multilayer structure including a buffer layer formed of $Al_xIn_yGa_{1-x-y}N$ (0≤x≤1, 0≤y≤1, 0≤x+y≤1) may be additionally formed on the substrate 310.

A mask 330 having a plurality of openings H and including an etch stop layer may be formed on the base layer 320.

The mask 330 employed in example embodiments may include a first material layer 330a formed on the base layer 320 and a second material layer 330b formed on the first material layer 330a and having an etching rate higher than that of the first material layer 330a.

The first material layer 330a may be provided as an etch stop layer. Namely, the first material layer 330a may have an etching rate lower than that of the second material layer 330b under etching conditions of the second material layer 330b. At least the first material layer may be a material having electrical insulation properties, and if necessary, the second material layer 330b may also be an insulating material.

The first and second material layers 330a and 330b may be formed of different materials in order to obtain a desired difference in etching rates. For example, the first material layer 330a may be a silicon nitride and the second material layer 330b may be a silicon oxide.

An overall thickness of the first and second material layers 330a and 330b may be designed in consideration of a desired height of the light emitting nanostructure. For example, the mask 330 may be formed to a level at least equal to or higher than a level of main portions of nanocores. In example embodiments, an etch stop level by the first material layer 330a may be designed in consideration of an overall height of the mask 330 from the surface of the base layer 320. After the first and second material layers 330a and 330b are sequentially formed on the base layer 320, a plurality of openings H may be formed to expose partial regions of the base layer 320. The openings H may be formed by forming a photoresist on the mask layer 330 and performing a photolithography and an anisotropic etching process using the photoresist. Sizes of the openings H may be designed in consideration of a desired size of light emitting nanostructures. For example, the openings H exposing surfaces of the base layer 320 may be 600 nm or less, and further, may range from 50 nm to 500 nm of the width (diameter).

The openings H may be formed using a semiconductor process. For example, the openings H having a high aspect ratio may be formed using a deep etching process. The aspect ratio of the openings H may be 5:1 or greater, and further, may be 10:1 or greater.

In general, anisotropic etching process is used as the deep etching process, in which reactive ions generated from plasma may be used or ion beams generated in a high vacuum state may be used. During the process of etching the mask 330, a fluorocarbon-based or hydrofluorocarbon-based gas may be used. For example, an etching gas obtained by mixing a gas selected from among $CF_4$, $C_2F_6$, $C_3F_8$, $C_4F_8$, $CHF_3$, $CH_2F_2$, and any combination thereof and $O_2$ and/or argon (Ar) may be used.

The mask 330 illustrated in FIG. 6A may include an array of openings H having circular cross-sections, but if necessary, the mask 330 may include an array of openings H having a cross-sections in any other shape (e.g., a hexagonal shape). The openings H illustrated in FIG. 6A have a rod structure having a uniform diameter (or width), but the present disclosure is not limited thereto and the openings H may have various other structures using an appropriate etching process. For example, the openings H may have a columnar structure having a cross-sectional area increasing downwardly, a columnar structure having a sectional area decreasing downwardly, a columnar structure having a sectional area decreasing downwardly and turning to increase from a certain point thereof, and a columnar structure having a sectional area increasing downwardly and turning to decrease from a certain point thereof.

Figure 6B:
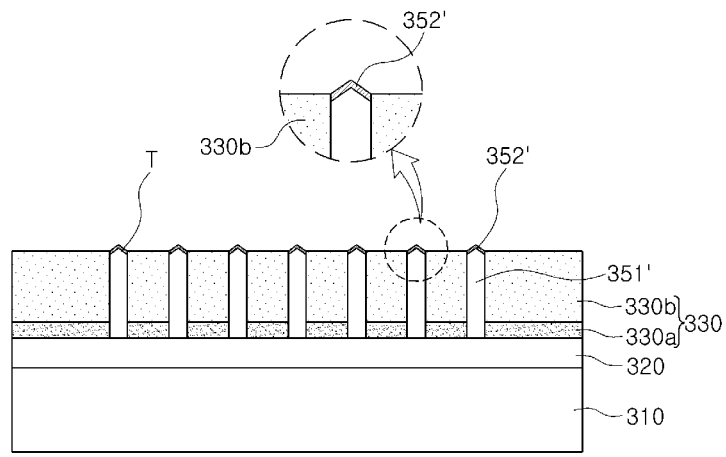

Thereafter, as illustrated in FIG. 6B, a first conductivity-type nitride semiconductor is grown in the exposed regions of the base layer 320 to fill the plurality of openings H, whereby a plurality of nanocores 351' may be formed and a current suppressing intermediate layer 352' may be formed on tip portions T of the nanocores 351'.

The nanocores 351' may be n-type nitride semiconductor and may be a material identical to that of the base layer 320. For example, the base layer 320 and the nanocores 351' may be formed of n-type GaN.

The nitride single crystal forming the nanocores 351' may be formed using a MOCVD or MBE process, and the mask 330 acts as a mold of the grown nitride single crystal to thus provide the nanocores 351' corresponding to the shape of the openings H. Namely, the nitride single crystal is selectively grown in the regions of the base layer 320 exposed from the openings H by the mask 330, filling the openings H, and the filling nitride single crystal may have a shape corresponding to that of the openings H.

With the mask 330 remaining as is, the current suppressing intermediate layer 352' may be formed on the surfaces of the tip portions T of the nanocores 351'. Thus, without a process of forming a mask, the current suppressing intermediate layer 352' may be easily formed on the desired tip portions T.

The current suppressing intermediate layer 352' may be a semiconductor layer undoped on purpose or doped with a second conductivity-type impurity opposite to that of the nanocores 351'. For example, in a case in which the nanocores 351' is n-type GaN, the current suppressing intermediate layer 352' may be undoped GaN or GaN doped with a p-type impurity such as magnesium (Mg). In an example embodiment, the nanocores 351' and the current suppressing intermediate layer 352' may be continuously formed by switching only types of impurities during an identical growth process. Thus, since a process of forming the current suppressing intermediate layer 352' and a mold processing are combined, an overall process may be simplified.

Figure 6C:
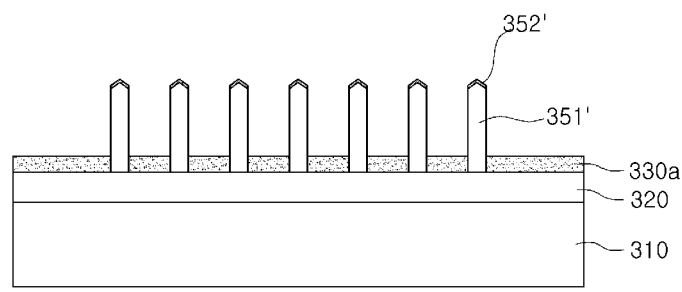

Subsequently, as illustrated in FIG. 6C, a portion of the mask 330, namely, the second material layer 330b, may be removed, while leaving the first material layer 330a, an etch stop layer, such that the lateral surfaces of the plurality of nanocores 351' are partially exposed.

In example embodiments, by applying an etching process to selectively remove the second material layer 330b, only the second material layer 330b may be removed, while the first material layer 330a remains. The remaining first material layer 330a may reduce or prevent a stress control layer 353, a defect blocking layer 355, an active layer 357, and a second conductivity-type nitride semiconductor layer 359 from being in physical contact with the base layer 320 in a follow-up growth process.

Figure 6D:
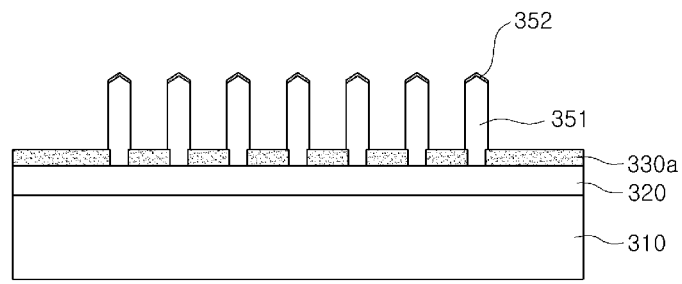

Thereafter, referring to FIG. 6D, in order to enhance crystallinity of the nanocores 351' and make the surfaces of the nanocores 351' thermodynamically stable crystal planes, a process of regrowing the nanocores 351' may be performed. Nanocores 351 formed after the regrowth may have a diameter greater than that of the nanocores 351' before the regrowth.

As in example embodiments, during the process of manufacturing the light emitting nanostructures using the mask 330 having the openings H as a mold, the nanocores 351' may have thermodynamically unstable surfaces. Such surfaces may not be advantageous for follow-up crystal growth. Thus, after the second material layer 330b is removed, the process of regrowing the nanocores 351' may be performed in order to enhance crystallinity of the nanocores 351' and make the surfaces of the nanocores 351' thermodynamically stable crystal faces.

For example, in a case in which the first conductivity-type semiconductor forming the nanocores 351' is n-type GaN, after the regrowth process is performed, the main portion of each nanocore 351 may have a hexagonal prism shape with m-planes, non-polar planes, and the tip portion of each nanocore 351 may have a hexagonal pyramid shape with r-planes, semi-polar planes. The current suppressing intermediate layer 352 disposed in the tip portion of each nanocore 351 may have r-planes.

The regrowth process may be performed, for example, under a hydrogen ($H_2$) atmosphere, and a precursor of a material forming semiconductor and source gases of impurities may be supplied to an interior of a process chamber. For example, in a case in which the first conductivity-type nitride semiconductor is n-type GaN, trimethylgallium (TMGa) easily decomposed under a hydrogen ($H_2$) atmosphere is supplied as a gallium precursor, and ammonia ($NH_3$) may be used as a nitrogen precursor. In order to inject impurities, a silane ($SiH_4$) gas may be used as a source gas. When the regrowth process is performed under the hydrogen ($H_2$) atmosphere, the r-planes of the tip portion may be passivated by hydrogen ($H_2$), and thus, lateral growth of the main portion, relative to the tip portion, may be induced. According to example embodiments, the regrowth process may be performed under a nitrogen ($N_2$) atmosphere or an atmosphere in which hydrogen ($H_2$) and nitrogen ($N_2$) are mixed.

A process temperature may be appropriately determined within a range from 950° C. to 1150° C. Process pressure may be appropriately selected within a range from 80 mbar to 220 mbar. Also, a concentration of an impurity injected during the regrowth process may be different from a concentration of an impurity injected for growing the nanocores 351'.

However, according to example embodiments, a heat treatment (regrowth) process may include a plurality of steps in which process conditions such as a temperature, pressure, atmosphere gas, and the like, are different.

Figure 6E:
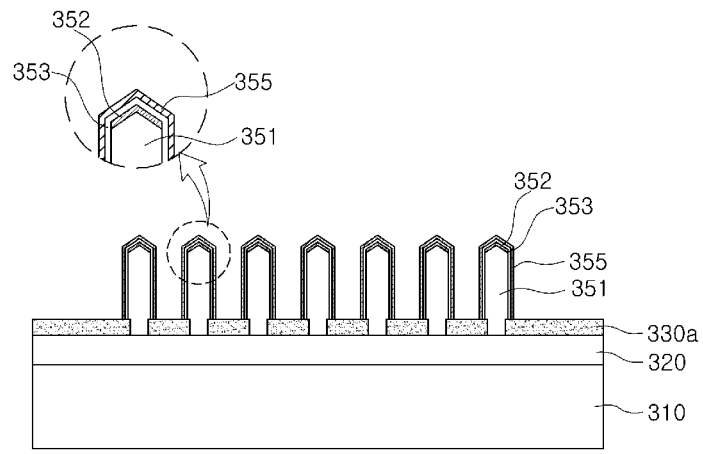

Thereafter, as illustrated in FIG. 6E, a stress control layer 353 may be formed on the surfaces of the plurality of nanocores 351.

The stress control layer 353 may be obtained by a growth process of a nitride semiconductor layer containing indium (In). In example embodiments, the stress control layer 353 may have a superlattice structure by alternately growing a first layer formed of $In_{x1}Ga_{1-x1}N$ ($0<x1<1$) and a second layer formed of $In_{x2}Ga_{1-x2}N$ ($0\leq x2<1$). According to an example embodiment, the stress control layer 353 may be implemented to have a multilayer structure, rather than the superlattice structure. The stress control layer 353 may be doped with a first conductivity-type impurity (e.g., an n-type impurity such as silicon (Si), germanium (Ge), and the like).

The defect blocking layer 355 may be obtained by a growth process of a nitride semiconductor layer containing aluminum (Al). The defect blocking layer 355 may be a single layer including a nitride semiconductor satisfying $Al_zGa_{1-z}N$ ($0.3\leq z\leq 0.4$). As described above with reference to FIG. 3B, the defect blocking layer 355 may have a multilayer structure in which a first blocking layer formed of $Al_{z1}Ga_{1-z1}N$ ($0.3\leq z1\leq 0.4$) and a second blocking layer formed of $Al_{z2}Ga_{1-z2}N$ ($0\leq z2\leq z1$) are alternately stacked. The defect blocking layer 355 may have a first conductivity type identical to that of the nanocores 351. For example, the defect blocking layer 355 may be doped with an n-type impurity.

Figure 6F:
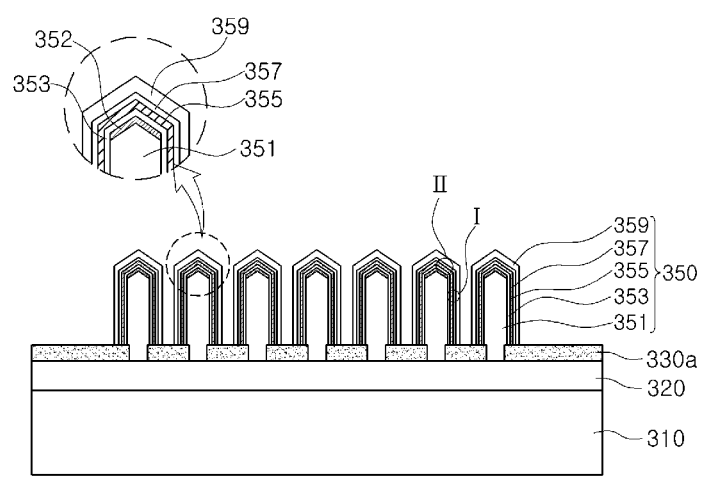

Subsequently, as illustrated in FIG. 6F, an active layer 357 and a second conductivity-type nitride semiconductor layer 359 may be sequentially grown on a surface of the defect blocking layer 355.

Through this process, each of the light emitting nanostructures 350 may have a core-shell structure including the nanocore 351, and the stress control layer 353, the defect blocking layer 355, the active layer 357, and the second conductivity-type nitride semiconductor layer 359 surrounding the nanocore 351'.

Each nanocore 351 may have a tip portion having crystal faces different from those of the main portion having a columnar shape, and as described above, a portion II of the active layer and the second conductivity-type nitride semiconductor layer formed in the tip portion and a portion I of the active layer and the second conductivity-type nitride semiconductor layer formed in the main portion may have different compositions and/or thicknesses. Thus, in order to solve the problem of a leakage current and a different wavelength generated in the tip portion, the current suppressing intermediate layer 352 is disposed in the tip portion of the nanocore 351. Due to the selective disposition of the current suppressing intermediate layer 352, a normal flow of a current through the active layer region formed in the main portion of the nanocore 351 may be guaranteed, while a flow of a current through the active region formed in the tip portion of the nanocore 351 may be blocked by the current suppressing intermediate layer 352. Accordingly, a leakage current generated in the tip portion of the nanocore 351 may be effectively suppressed, obtaining excellent luminous efficiency.

Figure 6G:
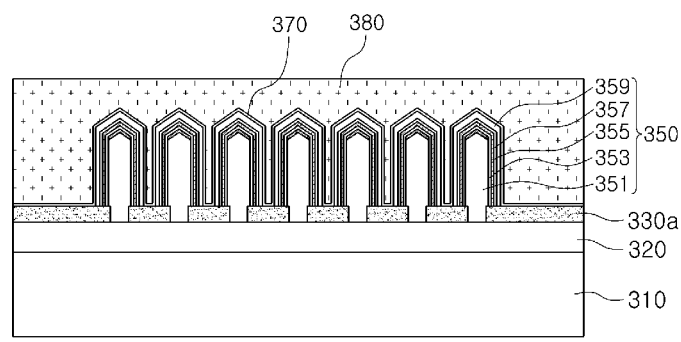

Subsequently, as illustrated in FIG. 6G, an insulating filler layer 380 may be formed to fill the spaces between the light emitting nanostructures 350.

The insulating filler layer 380 may be formed of a light-transmissive material. The insulating filler layer 380 may be formed through a thin film deposition process such as a CVD process or a PVD process, or a spin process, a reflow process, and the like. For example, the insulating filler layer 380 may be formed of a TEOS, BGSG, CVD-$SiO_2$, SOG, or SOD material. Alternatively, the insulating filler layer 380 may be formed of a light-transmissive resin selected from among an epoxy resin, a silicon resin, polyethylene, and polycarbonate.

FIG. 1 is a perspective view schematically illustrating a nanostructure semiconductor light emitting device according to an example embodiment of the present disclosure. FIG. 8 is a cross-sectional view of the nanostructure semiconductor light emitting device of FIG. 7 taken along line X-X'. In FIG. 8, a contact electrode layer 570 is omitted for the purposes of description.

Figure 7:
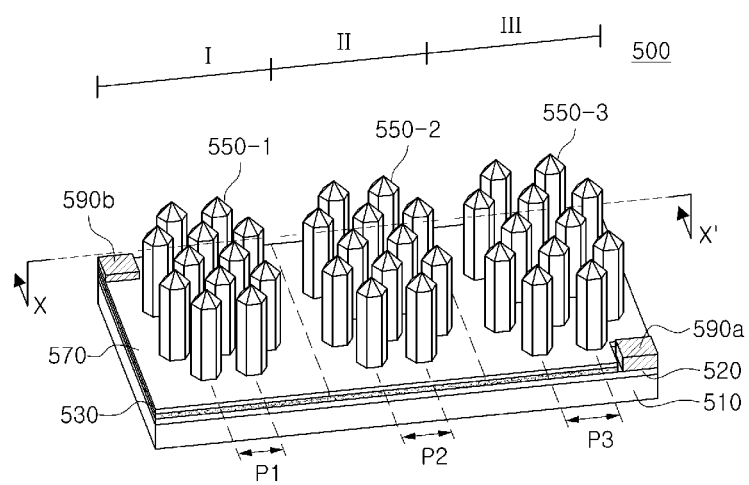
FIG. 7 is a perspective view schematically illustrating a nanostructure semiconductor light emitting device according to an example embodiment of the present disclosure.
Figure 8:
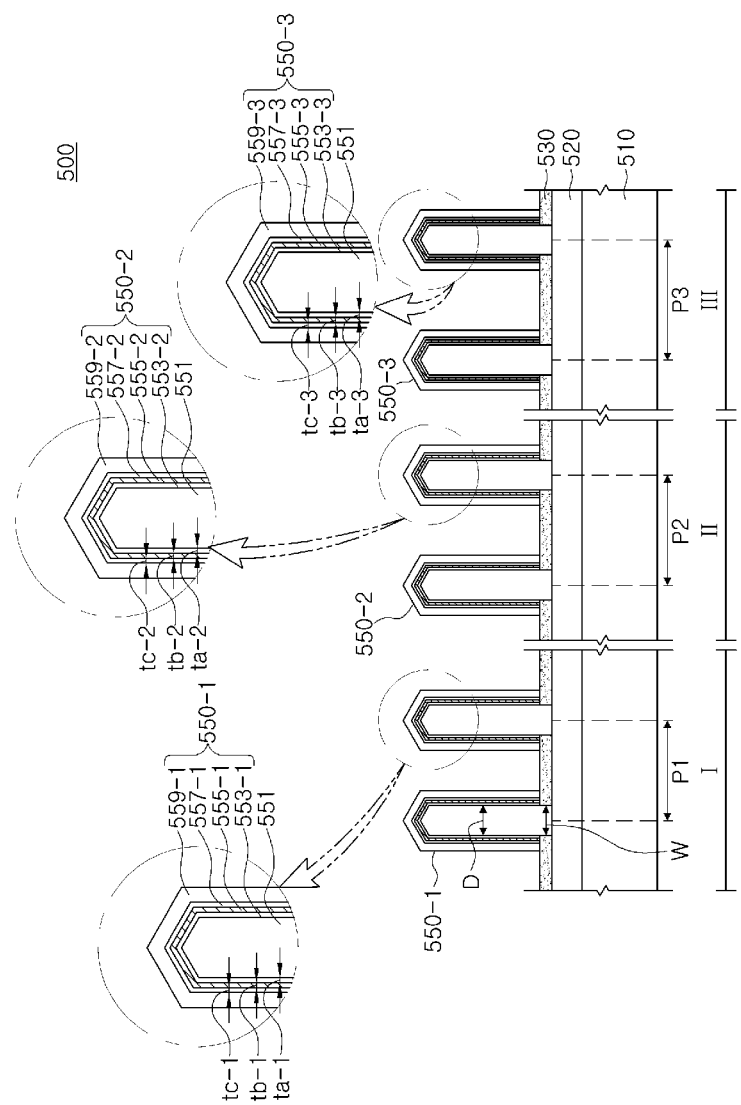
FIG. 8 is a cross-sectional view of the nanostructure semiconductor light emitting device of FIG. 7 taken along line X-X'.

A nanostructure semiconductor light emitting device 500 illustrated in FIGS. 7 and 8 may include a substrate 510, a base layer 520 disposed on the substrate 510 and formed of a first conductivity-type semiconductor material, and a plurality of light emitting nanostructures 550-1, 550-2, and 550-3 disposed on the base layer 520. The nanostructure semiconductor light emitting device 500 may further include an insulating layer 530 and a contact electrode layer 570. Descriptions of the components of the former example embodiments may be applied as is to these components unless they are not contradictory.

The light emitting nanostructures 550-1, 550-2, and 550-3 according to example embodiments may be divided into three groups (first to third groups) according to pitches P1, P2, and P3 of the nanocores 551. The pitch P1 of the first group may be smaller than a pitch P2 of the second group, and the pitch P2 of the second group may be smaller than the pitch P3 of the third group.

Light emitted from the light emitting nanostructures of each group may have different wavelengths. Light emitting nanostructures of at least one group may emit light having a peak wavelength equal to or greater than 540 nm.

The light emitting nanostructures 550-1, 550-2, and 550-3 of the first to third groups may be disposed in three regions I, II, and III dividing an upper surface of the base layer 520, respectively. In example embodiments, it is illustrated that the three divided regions I, II, and III have similar areas and are arranged in parallel, but the present disclosure is not limited thereto and the base layer 520 may be divided such that the regions have different areas or the regions have particular shapes. By adjusting the areas of the three divided regions I, II, and III, an amount of light obtained from the light emitting nanostructures 550-1, 550-2, and 550-3 of the first to third groups may be adjusted.

The light emitting nanostructures 550-1, 550-2, and 550-3 of the first to third groups may include stress control layers 553-1, 553-2, and 553-3, defect blocking layers 555-1, 555-2, and 555-3, active layers 557-1, 557-2, and 557-3, and second conductivity-type semiconductor layers 559-1, 559-2, and 559-3 sequentially disposed on the nanocores 551, respectively.

Growth processes of the stress control layers 553-1, 553-2, and 553-3, the defect blocking layers 555-1, 555-2, and 555-3, the active layers 557-1, 557-2, and 557-3, and the second conductivity-type semiconductor layers 559-1, 559-2, and 559-3 may be performed under identical conditions in regions I, II, and III. Namely, the growth processes may be performed by supplying an identical amount of sources under an identical temperature and pressure condition within an identical chamber. In spite of the identical process conditions, since the pitches P1, P2, and P3 of the nanocores 551 are different in regions I, II, and III, thicknesses of the layers grown on the nanocores 551 may differ in regions I, II, and III. In particular, the stress control layers 553-1, 553-2, and 553-3, the defect blocking layers 555-1, 555-2, and 555-3, the active layers 557-1, 557-2, and 557-3 may have different thicknesses in regions I, II, and III.

Thicknesses of the active layers in regions I, II, and III may increase as the pitches between nanocores increase (tc-1<tc-2<tc-3). Also, since the thicknesses of quantum well layers in each region are different, compositions (e.g., the content of indium (In)) in each region may be different. As a result, the active layers 557-1, 557-2, and 557-3 respectively formed in regions I, II, and III may emit light having different wavelengths. For example, the active layer 557-1 of the first region having the smallest first pitch P1 may have a thin quantum well and emit light having a short wavelength such as blue light, and the active layer 557-3 of the third region having the largest third pitch P3 may have a thick, quantum well and emit light having a relatively long wavelength such as red light. Also, the active layer 557-2 of the second region having the second pitch P2 may emit light having a wavelength therebetween such as green light.

Thicknesses of the stress control layers 553-1, 553-2, and 553-3 in regions I, II, and III may increase as the pitches between the nanocores increase, namely, from region I toward region III (ta-1<ta-2<ta-3). As the thicknesses of the stress control layers 553-1, 553-2, and 553-3 increase, specifically, as the thicknesses of the nitride semiconductor layers containing indium increase, a stacking fault may be generated within the stress control layers 553-1, 553-2, and 553-3. Since the content of indium increases according to an increase in the thicknesses of the stress control layers 553-1, 553-2, and 553-3, a stacking fault may be more easily generated in the stress control layer of region III than in the stress control layer of region I.

Also, thicknesses of the defect blocking layers 555-1, 555-2, and 555-3 in regions I, II, and III may increase as the pitches between the nanocores increase, namely, from region I toward region III (tb-1<tb-2<tb-3). As the thicknesses of the defect blocking layers 555-1, 555-2, and 555-3 increase, the effect of reducing or preventing a stacking fault generated in the stress control layers 553-1, 553-2, and 553-3 from propagating to the upper layers may increase. Thus, propagation of a stacking fault generated in the stress control layers may be more effectively reduced or prevented in region III than in region I.

The thicknesses of the stress control layers increase as the pitches between nanocores increase, increasing the possibility of generating a stacking fault. In this respect, however, since the thicknesses of the defect control layers increase, propagation of a generated stacking fault may be more effectively reduced or prevented, and thus, the light emitting nanostructure 550-3 in which a stacking fault of the active layer is reduced or prevented in region III may be obtained. In other words, even in the light emitting nanostructure 550-3 of the group (in particular, the third group) corresponding to a long wavelength band, crystal defects of the active layer 557-3 may be reduced or prevented, enhancing luminous efficiency. In addition, since the content of indium of the active layer can be increased, light having a relatively long wavelength band may be emitted.

In example embodiments, the stacking structure of the light emitting nanostructure has been described based on the stacking structure illustrated in FIG. 3A, but the present disclosure is not limited thereto. The stacking structures of the light emitting nanostructures described above with reference to FIGS. 3B though 3D may also be applied to example embodiments.

Figure 9:
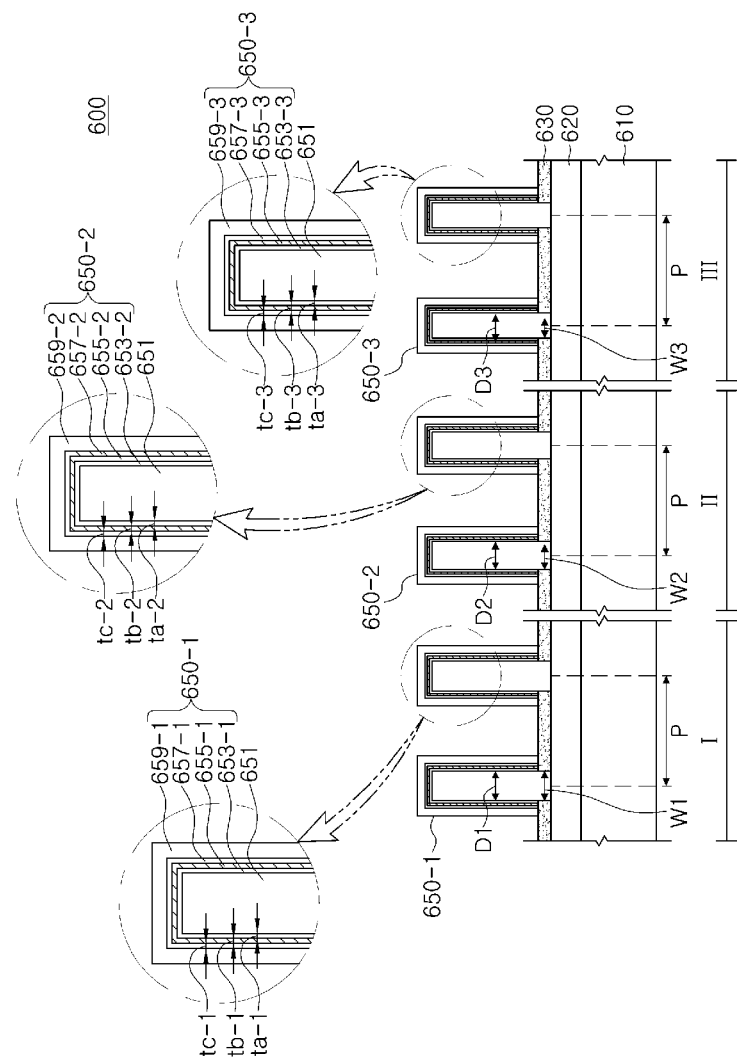
FIG. 9 is a cross-sectional view illustrating a nanostructure semiconductor light emitting device according to an example embodiment of the present disclosure.

FIG. 9 is a cross-sectional view illustrating a nanostructure semiconductor light emitting device according to example embodiments of the present disclosure.

A nanostructure semiconductor light emitting device 600 illustrated in FIG. 9 may include a substrate 610, a base layer 620 disposed on the substrate 610 and formed of a first conductivity-type semiconductor material, and a plurality of light emitting nanostructures 650-1, 650-2, and 650-3 disposed on the base layer 620.

The light emitting nanostructures 650-1, 650-2, and 650-3 according to example embodiments may be divided into three groups (first to third groups) according to diameters D1, D2, and D3 of the nanocores 651. The diameter D1 of the first group may be greater than the diameter D2 of the second group, and the diameter D2 of the second group may be greater than the diameter D3 of the third group.

Light emitted from the light emitting nanostructures of each group may have different wavelengths. Light emitting nanostructures of at least one group may emit light having a peak wavelength equal to or greater than 540 nm.

The light emitting nanostructures 650-1, 650-2, and 650-3 of the first to third groups may be disposed in three regions I, II, and III dividing an upper surface of the base layer 520, respectively. In example embodiments, it is illustrated that the three divided regions I, II, and III have similar areas and are arranged in parallel, but the present disclosure is not limited thereto and the base layer 520 may be divided such that the regions have different areas or the regions have particular shapes. By adjusting the areas of the three divided regions I, II, and III, an amount of light obtained from the light emitting nanostructures 650-1, 650-2, and 650-3 of the first to third groups may be adjusted. By appropriately adjusting the areas of the regions, white light may be obtained.

The light emitting nanostructures 650-1, 650-2, and 650-3 of the first to third groups may include stress control layers 653-1, 653-2, and 653-3, defect blocking layers 655-1, 655-2, and 655-3, active layers 657-1, 657-2, and 657-3, and second conductivity-type semiconductor layers 659-1, 659-2, and 659-3 sequentially disposed on the nanocores 651, respectively.

Growth processes of the stress control layers 653-1, 653-2, and 653-3, the defect blocking layers 655-1, 655-2, and 655-3, the active layers 657-1, 657-2, and 657-3, and the second conductivity-type semiconductor layers 659-1, 659-2, and 659-3 may be performed under identical conditions in regions I, II, and III. In spite of the identical process conditions, since the diameters D1, D2, and D3 of the nanocores 651 are different in regions I, II, and III, thicknesses of the layers grown on the nanocores 651 may differ in regions I, II, and III. In particular, the stress control layers 653-1, 653-2, and 653-3, the defect blocking layers 655-1, 655-2, and 655-3, the active layers 657-1, 657-2, and 657-3 may have different thicknesses in regions I, II, and III.

Thicknesses of the active layers in regions I, II, and III may increase as the diameters of the nanocores decrease (tc-1<tc-2<tc-3). Also, since the thicknesses of quantum well layers in each region are different, compositions (e.g., the content of indium (In)) in each region may be different. As a result, the active layers 657-1, 657-2, and 657-3 respectively formed in regions I, II, and III may emit light having different wavelengths. For example, the active layer 657-1 of the first region having the largest first diameter D1 may have a thin quantum well and emit light having a short wavelength such as blue light, and the active layer 657-3 of the third region having the smallest third diameter D3 may have a thick quantum well and emit light having a relatively long wavelength such as red light. Also, the active layer 657-2 of the second region having the second diameter D2 may emit light having a wavelength therebetween such as green light.

Thicknesses of the stress control layers 653-1, 653-2, and 653-3 in regions I, II, and III may increase as the diameters of the nanocores decrease, namely, from region I toward region III (ta-1<ta-2<ta-3). As the thicknesses of the stress control layers 653-1, 653-2, and 653-3 increase, specifically, as the thicknesses of the nitride semiconductor layers containing indium increase, a stacking fault may be generated within the stress control layers 653-1, 653-2, and 653-3. Since the content of indium increases according to an increase in the thicknesses of the stress control layers 653-1, 653-2, and 653-3, a stacking fault may be more easily generated in the stress control layer of region III than in the stress control layer of region I.

Also, thicknesses of the defect blocking layers 655-1, 655-2, and 655-3 in regions I, II, and III may increase as the diameters of the nanocores decrease, namely, from region I toward region III (tb-1<tb-2<tb-3). As the thicknesses of the defect blocking layers 655-1, 655-2, and 655-3 increase, the effect of reducing or preventing a stacking fault generated in the stress control layers 653-1, 653-2, and 653-3 from propagating to the upper layers may increase. Thus, propagation of a stacking fault generated in the stress control layers may be more effectively reduced or prevented in region III than in region I.

The thicknesses of the stress control layers increase as the diameters of the nanocores decrease, increasing the possibility of generating a stacking fault. In this respect, however, since the thicknesses of the defect control layers increase, propagation of a generated stacking fault may be more effectively reduced or prevented, and thus, the light emitting nanostructure 650-3 in which a stacking fault of the active layer is reduced or prevented in region III may be obtained. Even in the light emitting nanostructure 650-3 of the group (in particular, the third group) corresponding to a relatively long wavelength band, crystal defects of the active layer 657-3 may be reduced or prevented, enhancing luminous efficiency. In addition, since the content of indium of the active layer can be increased, light having a relatively long wavelength band may be emitted.

In example embodiments, the stacking structure of the light emitting nanostructure has been described based on the stacking structure illustrated in FIG. 3A, but the present disclosure is not limited thereto. The stacking structures of the light emitting nanostructures described above with reference to FIGS. 3B though 3D may also be applied to example embodiments.

Figure 10:
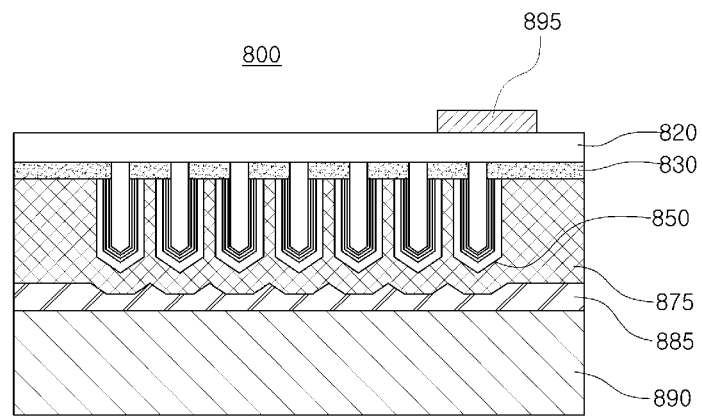
FIG. 10 is a cross-sectional view schematically illustrating an electrode structure applicable to an example embodiment of the present disclosure.

FIG. 10 is a cross-sectional view schematically illustrating an electrode structure applicable to example embodiments of the present disclosure.

Referring to FIG. 10, a nanostructure semiconductor light emitting device 800 according to example embodiments of the present disclosure may include a base layer 820, light emitting nanostructures 850 grown on the base layer 820, and a contact electrode layer 875 disposed to fill spaces between the light emitting nanostructures 850. Unlike those of the example embodiments described above with reference to FIGS. 1 through 7, the contact electrode layer 875 employed in example embodiments may be formed to be sufficiently thick to fill the spaces between the light emitting nanostructures 850. The contact electrode layer 875 may be formed of a material described above with reference to FIGS. 1 through 7, and in particular, in order to enhance light extraction efficiency, the contact electrode layer 875 may be formed of a reflective metal layer.

The nanostructure semiconductor light emitting device 800 according to example embodiments may include a support substrate 890 disposed on the contact electrode layer 875. A metal bonding layer 885 may be interposed between the contact electrode layer 875 and the support substrate 890, and the metal bonding layer 885 may bond the contact electrode layer 875 and the support substrate 890. The support substrate 890 may be a conductive substrate, for example, a silicon substrate or an Si—Al alloy substrate. As the metal bonding layer 885, a metal selected from the group consisting of Ni, Pt, Au, Cu, Co, Sn, In, Zn, Bi, Au, W, Ti, and any combination thereof, or an alloy may be used. For example, the metal bonding layer 885 may be a eutectic metal layer such as Ni/Sn or Au/Sn.

In example embodiments, the substrate used for the growth of the base layer 820 may be removed from the base layer 820. The process of removing the substrate may be executed using a laser lift-off process, a chemical lift-off process, or a polishing process.

A first electrode 895 may be disposed on a surface of the base layer 820 from which the substrate was removed. The support substrate 890, as a conductive substrate, may be used as a second electrode connected to an external circuit.

Figure 11:
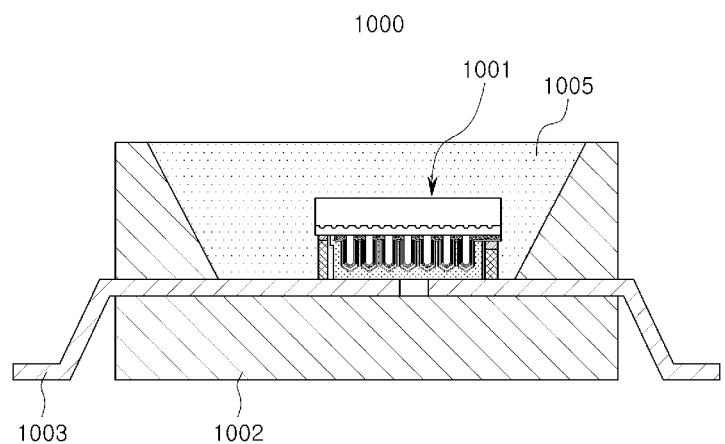
FIGS. 11 and 12 are cross-sectional views illustrating packages including a nanostructure semiconductor light emitting device according to an example embodiment of the present disclosure.
Figure 12:
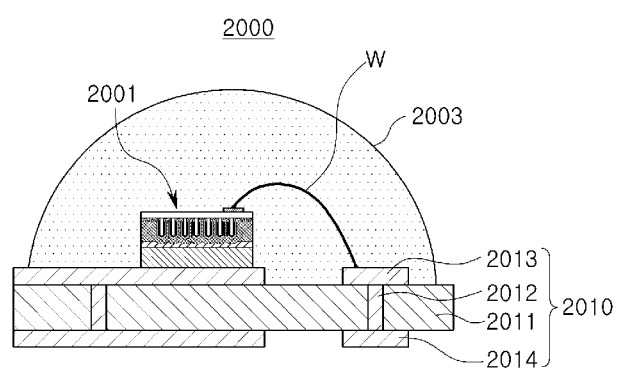

FIGS. 11 and 12 are cross-sectional views illustrating packages including a nanostructure semiconductor light emitting device according to example embodiments of the present disclosure.

Referring to FIG. 11, a semiconductor light emitting device package 1000 may include a nanostructure semiconductor light emitting device 1001, a package body 1002, and a pair of lead frames 1003. The nanostructure semiconductor light emitting device 1001 may be mounted on the lead frame 1003 and a pair of electrodes of the nanostructure semiconductor light emitting device 1001 may be electrically connected to the lead frame 1003. According to example embodiments, a pair of electrodes of the nanostructure semiconductor light emitting device 1001 may be electrically connected to the lead frame 1003 by a wire. Also, according to example embodiments, the nanostructure semiconductor light emitting device 1001 may be mounted on a different region, for example, on the package body 1002, rather than on the lead frame 1003. The package body 1002 may have a cup shape to improve efficiency in the reflectivity of light. An encapsulant 1005 formed of a light-transmissive material may be formed in the reflective cup to encapsulate the nanostructure semiconductor light emitting device 1001.

In example embodiments, the semiconductor light emitting device package 1000 is illustrated as including the semiconductor light emitting device 100 having a structure similar to that of the semiconductor light emitting device 100 illustrated in FIGS. 1 and 2. In detail, the semiconductor light emitting device 100 of FIG. 1 is mounted in a flipchip structure in which both the first and second electrodes 190*a* and 190*b* are disposed downwardly toward a mounting board 2010. However, according to example embodiments, the semiconductor light emitting device package 1000 may include the semiconductor light emitting device 100 of FIG. 1 mounted such that the first and second electrodes 190*a* and 190*b* face upwards, and may also include the semiconductor light emitting devices according to other example embodiments as described above.

Referring to FIG. 12, a semiconductor light emitting device package 2000 may include a nanostructure semiconductor light emitting device 2001, a mounting board 2010, and an encapsulant 2003. The nanostructure semiconductor light emitting device 2001 may be mounted on the mounting board 2010 and electrically connected to the mounting board 2010 by a wire W and the conductive support substrate 890 (please refer to FIG. 10).

The mounting board 2010 may include a board body 2011, an upper electrode 2013, and a lower electrode 1014. Also, the mounting board 2010 may include a through electrode 2012 connecting the upper electrode 2013 and the lower electrode 2014. The mounting board 2010 may be provided as a board such as PCB, MCPCB, MPCB, FPCB, or the like, and the structure of the mounting board 2010 may be applied to have various forms.

The encapsulant 2003 may be formed to have a lens structure with an upper surface having a convex dome shape. However, according to example embodiments, the encapsulant 2003 may have a lens structure having a convex or concave surface to adjust a beam angle of light emitted through an upper surface of the encapsulant 2003. If necessary, a wavelength conversion material such as a phosphor, quantum dot, and the like, may be disposed in the encapsulant 2003 or on a surface of the nanostructure semiconductor light emitting device 2001.

In example embodiments, the semiconductor light emitting device package 2000 is illustrated as including the semiconductor light emitting device 2001 having a structure identical to that of the semiconductor light emitting device 800 illustrated in FIG. 10, but it may also include the semiconductor light emitting devices according to other example embodiments of the present disclosure described above.

Figure 13:
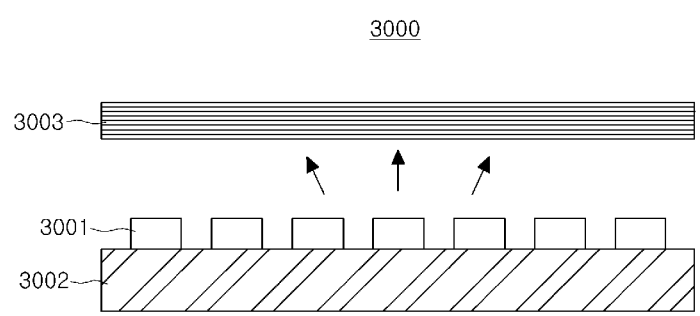
FIGS. 13 and 14 illustrate examples of backlight units employing a nanostructure semiconductor light emitting device according to an example embodiment of the present disclosure.
Figure 14:
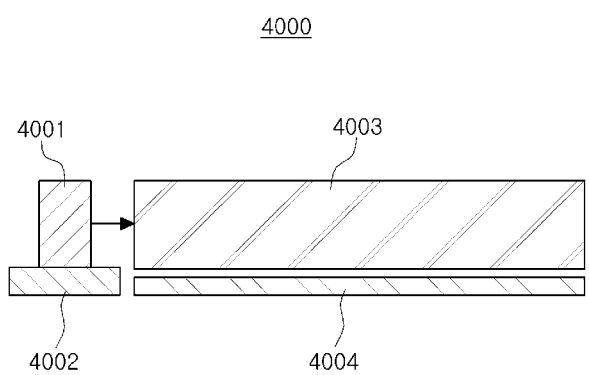

FIGS. 13 and 14 illustrate examples of backlight units employing a nanostructure semiconductor light emitting device according to example embodiments of the present disclosure.

Referring to FIG. 13, a backlight unit 3000 includes light sources 3001 mounted on a substrate 3002 and one or more optical sheets 3003 disposed above the light sources 3001. The semiconductor light emitting device package having the structure described above with reference to FIGS. 11 and 12 or a structure similar thereto may be used as the light sources 3001. Alternatively, a semiconductor light emitting device may be directly mounted on the substrate 3002 (a so-called chip-on-board (COB) type) and used.

Unlike the backlight unit 3000 in FIG. 13 in which the light sources 3001 emit light toward an upper side where a liquid crystal display is disposed, a backlight unit 4000 as another example illustrated in FIG. 14 is configured such that a light source 4001 mounted on a substrate 4002 emits light in a lateral direction, and the emitted light may be made to be incident to a light guide plate 4003 so as to be converted into a surface light source. Light, passing through the light guide plate 4003, is emitted upwards, and in order to enhance light extraction efficiency, a reflective layer 4004 may be disposed on a lower surface of the light guide plate 4003.

Figure 15:
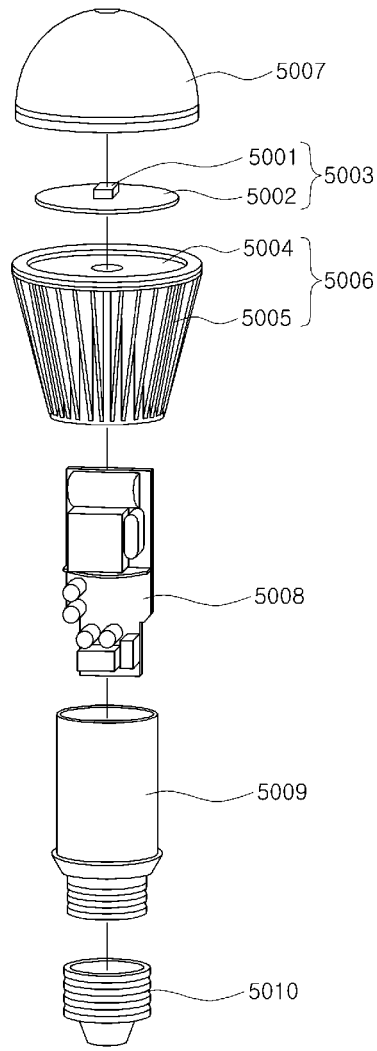
FIG. 15 is a view illustrating an example of a lighting device employing a nanostructure semiconductor light emitting device according to an example embodiment of the present disclosure.

FIG. 15 is a view illustrating an example of a lighting device employing a nanostructure semiconductor light emitting device according to example embodiments of the present disclosure.

Referring to the exploded perspective view of FIG. 15, a lighting device 5000 is illustrated as, for example, a bulb-type lamp and includes a light emitting module 5003, a driving unit 5008, and an external connection unit 5010. Also, the lighting device 5000 may further include external structures such as external and internal housings 5006 and 5009 and a cover unit 5007. The light emitting module 5003 may include a semiconductor light emitting device 5001 having a structure identical or similar to those of the nanostructure semiconductor light emitting devices according to example embodiments described above and a circuit board 5002 on which the semiconductor light emitting device 5001 is mounted. In example embodiments, it is illustrated that a single semiconductor light emitting device 5001 is mounted on the circuit board 5002, but a plurality of semiconductor light emitting devices may be installed as needed. Also, the semiconductor light emitting device 5001 may be manufactured as a package and subsequently mounted, rather than being directly mounted on the circuit board 5002.

The external housing 5006 may serve as a heat dissipation unit and may include a heat dissipation plate 5004 disposed to be in direct contact with the light emitting module 5003 to enhance heat dissipation and heat dissipation fins 5005 surrounding the lateral surfaces of the lighting device 5000. Also, the cover unit 5007 may be installed on the light emitting module 5003 and have a convex lens shape. The driving unit 5008 may be installed in the internal housing 5009 and connected to the external connection unit 5010 having a socket structure to receive power from an external power source. Also, the driving unit 5008 may serve to convert power into an appropriate current source for driving the semiconductor light emitting device 5001 of the light emitting module 5003, and provide the same. For example, the driving unit 5008 may be configured as an AC-DC converter, a rectifying circuit component, or the like.

Also, although not shown, the lighting device 5000 may further include a communications module.

Figure 16:
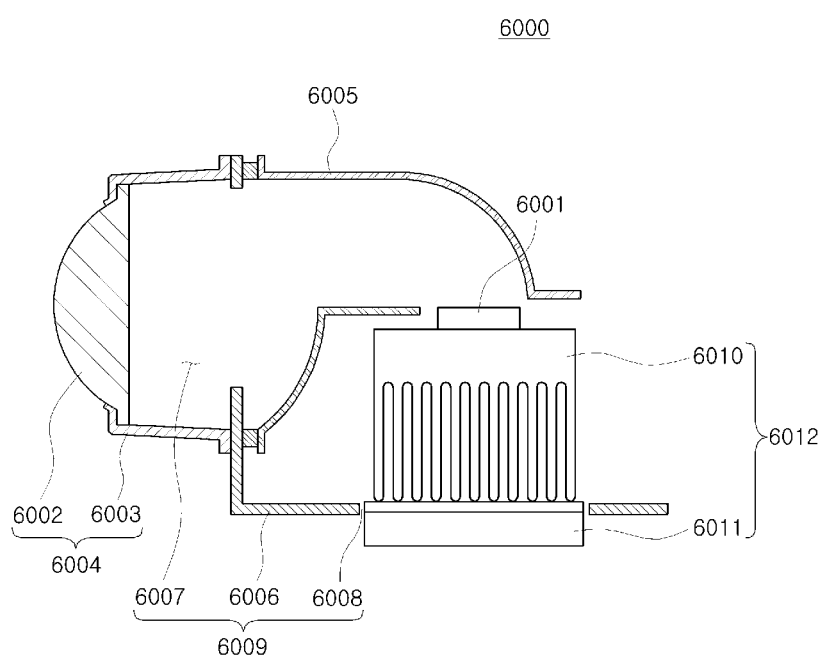
FIG. 16 is a view illustrating an example of a headlamp employing a nanostructure semiconductor light emitting device according to an example embodiment of the present disclosure.

FIG. 16 is a view illustrating an example of a headlamp employing a nanostructure semiconductor light emitting device according to example embodiments of, the present disclosure.

Referring to FIG. 16, a headlamp 6000 used as a vehicle lamp, or the like, may include a light source 6001, a reflective unit 6005, and a lens cover unit 6004. The lens cover unit 6004 may include a hollow guide 6003 and a lens 6002. The light source 6001 may include at least one of semiconductor light emitting device packages of FIGS. 11 and 12. The headlamp 6000 may further include a heat dissipation unit 6012 outwardly dissipating heat generated by the light source 6001. In order to effectively dissipate heat, the heat dissipation unit 6012 may include a heat sink 6010 and a cooling fan 6011. Also, the headlamp 6000 may further include a housing 6009 fixedly supporting the heat dissipation unit 6012 and the reflective unit 6005, and the housing 6009 may have a main unit 6006 and a central hole 6008 formed in one surface thereof, to which the heat dissipation unit 6012 is coupled. Also, the housing 6009 may have a front hole 6007 formed in the other surface integrally connected to the one surface and bent in a right angle direction. The reflective unit 6005 is fixed to the housing 6009 such that light generated by the light source 6001 is reflected thereby to pass through the front hole 6007 to be output outwardly.

As set forth above, according to example embodiments of the present disclosure, by interspersing a defect blocking layer able to reduce or prevent propagation of defects (linear defect or stacking fault) generated from a lower layer, defects within the active layer may be reduced or prevented, increasing luminous efficiency. Also, the content of indium of the active layer may be increased, and as a result, the active layer emitting light having a longer wavelength under the same process conditions may be provided.

Advantages and effects of the present disclosure are not limited to the foregoing content and may be easily understood from the described specific example embodiments of the present disclosure.

Additionally, each of the features described above may be combined in any appropriate manner to obtain nanostructure semiconductor light emitting devices, light emitting nanostructures, methods, and/or apparatuses with various combinations of features. In this regard, U.S. application Ser. No. 14/551,978, filed Nov. 24, 2014; Ser. No. 14/723,869, filed May 28, 2015; Ser. No. 13/599,430, filed Aug. 30, 2012; Ser. No. 14/501,232, filed Sep. 30, 2014; U.S. application Ser. No. 14/828,004, filed Aug. 17, 2015; and U.S. application Ser. No. 14/833,832, filed Aug. 24, 2015 are each hereby incorporated by reference in their entirety, thereby disclosing additional nanostructure semiconductor light emitting devices, light emitting nanostructures, methods, and/or apparatuses with various additional combinations of features.

While example embodiments have been shown and described above, it will be apparent to those skilled in the art that modifications and variations could be made without departing from the scope of the present disclosure as defined by the appended claims.

What is claimed is:

1. A nanostructure semiconductor light emitting device comprising:
   a base layer of a first conductivity-type nitride semiconductor; and
   a plurality of light emitting nanostructures spaced apart from one another on the base layer,
   wherein each of the plurality of light emitting nanostructures comprises:
   a nanocore of the first conductivity-type nitride semiconductor;
   a stress control layer on a surface of the nanocore and including a nitride semiconductor containing indium;
   an active layer on the stress control layer;
   a second conductivity-type nitride semiconductor layer on the active layer; and
   a defect blocking layer on at least a portion of the stress control layer and including a nitride semiconductor layer having a lattice constant lower than that of the stress control layer.

2. The nanostructure semiconductor light emitting device of claim 1, wherein the defect blocking layer is between the stress control layer and the active layer.

3. The nanostructure semiconductor light emitting device of claim 1, wherein the defect blocking layer is interspersed with the stress control layer.

4. The nanostructure semiconductor light emitting device of claim 3, wherein the stress control layer has a structure in which a first layer of $In_{x1}Ga_{1-x1}N$ ($0<x1<1$) and a second layer of $In_{x2}Ga_{1-x2}N$ ($0\leq x2<x1$) are alternately stacked.

5. The nanostructure semiconductor light emitting device of claim 4, wherein the defect blocking layer is above the first layer.

6. The nanostructure semiconductor light emitting device of claim 4, wherein the defect blocking layer is interspersed with the second layer.

7. The nanostructure semiconductor light emitting device of claim 1, wherein the defect blocking layer is interspersed with the active layer.

8. The nanostructure semiconductor light emitting device of claim 7, wherein the active layer has a structure in which a quantum well layer of $In_{y1}Ga_{1-y1}N$ ($0<y1<1$) and a quantum barrier layer of $In_{y2}Ga_{1-y2}N$ ($0\leq y2<y1$) are alternately stacked.

9. The nanostructure semiconductor light emitting device of claim 8, wherein the defect blocking layer is inserted into the quantum barrier layer.

10. The nanostructure semiconductor light emitting device of claim 1, wherein the defect blocking layer includes $Al_{z1}Ga_{1-z1}N$ ($0.3\leq z1\leq 0.4$).

11. The nanostructure semiconductor light emitting device of claim 1, wherein the defect blocking layer has a multilayer structure in which a first blocking layer of $Al_{z1}Ga_{1-z1}N$ ($0.3\leq z1\leq 0.4$) and a second blocking layer of $Al_{z2}Ga_{1-z2}N$ ($0\leq z2\leq z1$) are alternately stacked.

12. The nanostructure semiconductor light emitting device of claim 1, wherein the defect blocking layer has a thickness ranging from 15 nm to 40 nm.

13. A nanostructure semiconductor light emitting device comprising:
   a base layer of a first conductivity-type nitride semiconductor; and
   a plurality of light emitting nanostructures spaced apart from one another on the base layer,
   wherein each of the plurality of light emitting nanostructures comprises:
   a nanocore of the first conductivity-type nitride semiconductor;
   a stress control layer on a surface of the nanocore and including a nitride semiconductor containing indium;
   an active layer on the stress control layer;
   a second conductivity-type nitride semiconductor layer on the active layer; and
   a defect blocking layer on at least a portion of the stress control layer and including a nitride semiconductor layer having a lattice constant lower than that of the stress control layer, wherein the plurality of light emitting nanostructures include three groups in which diameters of the nanocores or pitches between the nanocores are different.

14. The nanostructure semiconductor light emitting device of claim 13, wherein, a thickness of the defect blocking layer of a group, among the three groups, emitting light having a longer wavelength is greater.

15. The nanostructure semiconductor light emitting device of claim 13, wherein one of the three groups emits light having a peak wavelength equal to or greater than 540 nm.

16. A light emitting nanostructure comprises:
- a nanocore of a first conductivity-type nitride semiconductor;
- a stress control layer on a surface of the nanocore and including a nitride semiconductor containing indium;
- an active layer on the stress control layer;
- a second conductivity-type nitride semiconductor layer on the active layer; and
- a defect blocking layer on at least a portion of the stress control layer and including a nitride semiconductor layer having a lattice constant lower than that of the stress control layer.

17. The light emitting nanostructure of claim 16, wherein at least two of the stress control layer, the active layer, and the defect blocking layer are multi-layer structures the multi-layers of at least two of the stress control layer, the active layer, and the defect blocking layer are interspersed.

18. The light emitting nanostructure of claim 16, wherein the light emitting nanostructure includes a main portion and a tip portion, the light emitting nanostructure further comprising a current suppressing intermediate layer on only the tip portion.

19. A nanostructure semiconductor light emitting device comprising:
- a base layer of the first conductivity-type nitride semiconductor; and
- a plurality of light emitting nanostructures of claim 16, spaced apart from one another on the base layer.

20. The nanostructure semiconductor light emitting device of claim 19, wherein the plurality of light emitting nanostructures are arranged in three groups in which diameters of the nanocores or pitches between the nanocores are different.

* * * * *